(12) United States Patent
Masui

(10) Patent No.: US 8,698,132 B2
(45) Date of Patent: Apr. 15, 2014

(54) FUNCTIONAL MOLECULAR ELEMENT, MANUFACTURING METHOD THEREOF, AND FUNCTIONAL MOLECULAR DEVICE

(75) Inventor: Eriko Masui, Tokyo (JP)

(73) Assignee: Sony Corporation, Tokyo (JP)

(*) Notice: Subject to any disclaimer, the term of this patent is extended or adjusted under 35 U.S.C. 154(b) by 353 days.

(21) Appl. No.: 12/999,161

(22) PCT Filed: Jun. 12, 2009

(86) PCT No.: PCT/JP2009/060760
§ 371 (c)(1),
(2), (4) Date: Dec. 15, 2010

(87) PCT Pub. No.: WO2009/154145
PCT Pub. Date: Dec. 23, 2009

(65) Prior Publication Data
US 2011/0101324 A1    May 5, 2011

(30) Foreign Application Priority Data
Jun. 19, 2008 (JP) ................................. 2008-160815

(51) Int. Cl.
*H01L 29/08* (2006.01)
(52) U.S. Cl.
USPC ............................................................. 257/40
(58) Field of Classification Search
USPC .............................. 257/40, E51.006, E31.007
See application file for complete search history.

(56) References Cited

U.S. PATENT DOCUMENTS

| | | | |
|---|---|---|---|
| 6,128,214 A | 10/2000 | Kuekes et al. | |
| 6,256,767 B1 | 7/2001 | Kuekes et al. | |
| 6,284,562 B1 * | 9/2001 | Batlogg et al. | ................. 257/350 |

(Continued)

FOREIGN PATENT DOCUMENTS

| | | |
|---|---|---|
| CN | 1881643 | 12/2006 |
| CN | 10-1331611 | 5/2007 |

(Continued)

OTHER PUBLICATIONS

Chen, et al "Large On-Off Ratios and Negative Differential Resistance in a Molecular Electronic Device", www.sciencemag.org, vol. 286, Nov. 19, 1999, pp. 1550-1551.

(Continued)

*Primary Examiner* — Cuong Q Nguyen
(74) *Attorney, Agent, or Firm* — K&L Gates LLP

(57) ABSTRACT

A functional molecule (10) is constructed of electrodes (5,6), which are formed of pSi (polysilicon) and are opposing each other, and a molecular array structure (7), and the molecular array structure is formed of interface modifier molecules (2), which are covalently coupled to surfaces of the electrodes (5,6) to modify the surfaces, and driver molecules (1) repeatedly stacked in one direction between the interface modifier molecules. The interface modifier molecules each have a nearly discoid skeleton of a π-electron conjugated system and side chains, are arranged with planes of their skeletons lying substantially in parallel to the surfaces of both the electrodes, and are covalently coupled at their side chains to Si atoms in both the electrodes. The driver molecules are of a π-electron conjugated system, and upon application of an electrical field, change in structure or orientation and hence change in dielectric constant, in other words, conductivity. The driver molecules are functional molecules of a complex having a Zn ion approximately at its center. The interface modifier molecules and driver molecules are stacked together by intermolecular π-π stacking, and so the driver molecules themselves.

19 Claims, 13 Drawing Sheets

(56) References Cited

U.S. PATENT DOCUMENTS

| | | |
|---|---|---|
| 7,476,894 B2 | 1/2009 | Toyoda |
| 2006/0278868 A1* | 12/2006 | Matsui .......................... 257/40 |
| 2010/0244938 A1 | 9/2010 | Matsui et al. |

FOREIGN PATENT DOCUMENTS

| | | |
|---|---|---|
| EP | 1734594 | 12/2006 |
| JP | 2004-266100 | 9/2004 |
| JP | 2005-228773 | 8/2005 |
| JP | 2006-100618 | 4/2006 |
| JP | 2006-283014 | 10/2006 |
| JP | 2006-351623 | 12/2006 |
| JP | 2008-124360 | 5/2008 |
| KR | 10-2006-0129947 | 12/2006 |
| WO | 2008-059797 | 5/2008 |
| WO | 2007-135861 | 4/2010 |

OTHER PUBLICATIONS

Murphy, et al. "Feedback Connections to the Lateral Geniculate Nucleus and Cortical Response Properties", www.sciencemag.org, vol. 286, Nov. 19, 1999, p. 1552.

Wessels, et al. "Optical and Electrical Properties of Three-Dimensional Interlinked Gold Nanoparticle Assemblies", J. Am. Chem. Soc., 2004, pp. 3349-3356.

Reed, et al. "Conductance of a Molecular Junction" www.sciencemag.org, Oct. 10, 1997, vol. 278, pp. 252-254.

* cited by examiner (A)

(B)

(C)

(A)

(B)

(A)

NO TRANSISTOR CHARACTERISTICS (B)

(A)

(B)

FUNCTIONAL MOLECULAR ELEMENT, MANUFACTURING METHOD THEREOF, AND FUNCTIONAL MOLECULAR DEVICE

CROSS REFERENCE TO RELATED APPLICATIONS

The present application is a national stage of International Application No. PCT/JP2009/060760 filed on Jun. 12, 2009 and claims priority to Japanese Patent Applications Nos. 2008-160815 filed on Jun. 19, 2008 the disclosures of which are incorporated herein by reference.

BACKGROUND

This invention relates to a functional molecular element that changes in conductivity upon application of an electric field, a process for its fabrication, and a functional molecular device.

Nanotechnology is to observe, produce and/or utilize a microstructure the size of which is of the order of one one-billionth of a meter ($10^{-8}$ m=10 nm).

An extremely high-accuracy microscope called "scanning tunneling microscope" was invented in the late 1980's, and made it possible to observe atoms and molecules individually. The use of a scanning tunneling microscope has made it possible not only to observe atoms and molecules but also to manipulate them individually.

For example, writing letters with atoms arranged on a crystal surface has been reported. Despite its capability of manipulation of atoms and molecules, it is not practical to create a new material or to assemble a new device by manipulating an immense number of atoms and molecules individually.

Making a structure of nanometer size by manipulating atoms or molecules or groups thereof individually requires a new technology for ultraprecision fabrication. Roughly categorizing such microprocessing technologies with accuracy of the order of nanometers, two methods are known.

One is the so-called top-down method which has conventionally been used to fabricate various semiconductor devices. It is exemplified by fabrication of integrated circuits from a large silicon wafer by extremely accurate etching to the very limits. The other is the so-called bottom-up method, which is designed to assemble a desired nanostructure from atoms and molecules as extremely small constituents.

The limit of size of nanostructure that could be achieved by the top-down method is suggested by well-known Moore's law (proposed in 1965 by Gordon Moore as a co-founder of Intel Corporation) which stipulates that "the number of transistors on a chip will be doubling every 18 months." Over the past 30 years since 1965, the semiconductor industry has increased the rate of integration of transistors as predicted by Moore's law.

The International Technology Roadmap for Semiconductor (ITRS) for Coming 15 Years, which was published by the Semiconductor Industry Association (SIA), includes a view that Moore's law will continue to remain effective.

As the degree of microfabrication increases further, the resulting semiconductor chips run faster with less power consumption. Moreover, improved microfabrication yields more products from a single wafer, thereby making it possible to reduce the production cost. This is the reason why microprocessor makers compete in the process rule for new products and the degree of transistor integration.

It is, however, indicated that Moore's law will reach a limit before too long in the light of natural rule.

According to the current major semiconductor technology, for example, semiconductor chips are fabricated by forming circuit patterns on silicon wafers in accordance with a lithographic technology. It is, therefore, necessary to improve the resolution for further miniaturization. To this end, it is necessary to develop a practical technology to employ light with a shorter wavelength.

Another problem involved in increasing the degree of integration is excessive heat evolution per semiconductor chip, which leads to malfunction or thermal breakage of heated semiconductor chips.

Moreover, there are some experts who predict that miniaturization of semiconductor chips that continues at the present pace will reach the stage in which equipment cost and process cost go up and yields go down. As a result, the semiconductor industry will not pay in around the year 2015.

A still more serious problem which has been pointed out recently is line edge roughness (or minute irregularities around pattern edges). As to irregularities on the surface of a resist mask, it is said that the size of molecules constituting a resist and the distance of diffusion of an acid in a chemically amplified photoresist become critical as the pattern size is reduced more than before. The magnitude of a cycle of irregularities on a pattern edge has also been evaluated for its effect on the characteristics of a device, and has arisen as another important problem.

As a new technology to resolve the above-mentioned bottleneck of the top-down method, attention is attracted to research that attempts to provide each molecule with a function as an electronic part. Illustrative is an electronic device (molecular switch or the like) fabricated from individual molecules by the bottom-up method.

Concerning metals, ceramics, or semiconductors, research is also under way to make structures of nanometer size by the bottom-up method. It would be possible to design and create, by the bottom-up method, (molecular) devices entirely different in characteristics from ones in the related conventional art if good use is made of millions of species of diverse molecules independently varying in size and function.

For example, conductive molecules have a width as small as 0.5 nm. Lines of these molecules can realize thousands times high-density wirings compared with the line width of 100 nm or so achieved in the current IC technology. Moreover, it would be possible, for example, to realize a recoding device with a capacity larger than 10,000 times that of DVD if individual molecules are used as memory elements.

Molecular devices are synthesized by a chemical process unlike conventional silicon semiconductors. The world's first organic transistor of polythiophene (polymer) was developed in 1986 by Hiroshi Koezuka of Mitsubishi Electric Corporation.

Further, a group of researchers from Hewlett-Packard Company and the University of California at Los Angeles in the US succeeded in developing organic electronic devices, published them in the July 1999 issue of Science, and filed patent applications on them (see Patent Document 1 and Patent Document 2 to be described subsequently herein). They also made switches from molecular films composed of millions of rotaxane molecules (which are organic molecules) and completed an AND gate, a fundamental logic circuit, by connecting them together.

A joint research group between Rice University and Yale University in the US succeeded in creating a molecular switch the molecular structure of which changes upon injection of electrons under the effect of an electric field to perform a switching operation. They published it in the November 1999 issue of Science (see Non-patent Document 1 to be described subsequently herein). It has a function to repeatedly perform on-off switching, which was not achieved by the group of researchers from Hewlett-Packard Company and the University of California at Los Angeles. In addition, it has one millionth of the size of ordinary transistor, and this smallness will contribute to the manufacture of small high-performance computers.

Prof. J. Tour (of Rice University, chemistry) who succeeded in the synthesis suggests that the fabrication cost of molecular switches would be only one thousandth of that of conventional semiconductors because of the obviation of expensive clean rooms which would generally be used for the fabrication of semiconductors. He is planning on constructing a hybrid computer (composed of organic molecules and silicon) in five to ten years.

A great deal of research has been carried out on molecular devices with functions of electronic components as mentioned above. However, most of the past research on molecular devices is directed to those which are driven by light, heat, protons, ions or the like (see, for example, Non-Patent Document 2 to be described subsequently herein), and those which are driven by an electric field are limited in number.

With respect to these molecular devices, the above-mentioned problem of line edge roughness also arises as a serious problem, and is expected to become more serious as the pattern is miniaturized further. As a method for avoiding this problem with respect to molecular devices, it is a common practice to introduce a thiol group into a terminal of a molecule for direct coupling to a gold electrode (see, for example, Non-Patent Document 3 to be described subsequently herein). Molecular devices are superior in reproducibility to those of inorganic materials because their molecules themselves are smaller in size than the minimum unit that causes the problem of roughness.

However, the electrical connection between the thiol group and the gold electrode involves a problem in that, no matter how good electrical properties the molecule itself has, the connecting part between the terminal thiol group and the electrode has large electric resistance and this large electric resistance limits improvements in the characteristic properties of the molecular device (see Non-Patent Document 4 to be described subsequently herein).

In the development of molecular devices, it has been studied to use a variety of organic molecules. Illustrative are a group of compounds called "tetrapyrroles" each of which contains four pyrrole rings. Tetrapyrroles include those having cyclic structures and those having acyclic structures. Those having cyclic structures include, for example, porphyrin, which has a ring (tetrapyrrole ring) that four pyrrole rings are linked together via one carbon atom between each two adjacent ones of the pyrrole rings, and its derivatives. It is known that porphyrin and its derivatives form stable metal complexes with many metal atoms and each of these metal complexes takes a stacked structure with planes of porphyrin rings being stacked one over the other. Those having acyclic structures, on the other hand, are called "acyclic tetrapyrrole," "ring-opened tetrapyrrole" or "linear pyrrole" in which four pyrrole rings are linearly linked together via one carbon atom between each two adjacent ones of the pyrrole rings.

A description will hereinafter be made about certain examples of reports on tetrapyrrole-containing molecular devices.

Referring first to Patent Document 3 entitled "Photo-Functional Molecular Element with Porphyrin Polymer Fixed and Stacked on Substrate through Covalent Bonds and Method of Preparing the Same" and to be described subsequently herein, it is described that subsequent to application of a linker polyphyrin onto a gold substrate, the substrate is immersed in a solution of an imidazole-substituted zinc porphyrin to stack a polyphyrin polymer through coordinate bonds.

Patent Document 4 entitled "Functional Molecular Element" and to be described subsequently herein contains descriptions as will be described hereinafter.

There is a description about a functional molecular element constructed by using a system which changes in the anisotropy of dielectric constant by a change in molecular structure as induced by an electric field. It is described to be preferable for such a functional molecular element to use molecules of an organic metal complex formed of an organic molecule, which is equipped with dielectric constant anisotropy and changes in structure under the effect of an electric field, and a metal ion. The organic molecule may have, for example, linear side chains, and may desirably be discoid (or nearly discoid).

The functional molecular element is described to preferably form a columnar array structure that nearly discoid, organic metal complex molecules having side chains are arrayed in a columnar form between a pair of mutually-opposing electrodes. It is also described that the nearly discoid, organic molecule having the side chains may preferably be that of a biladienone derivative such as biliverdine or biladienone and the metal ion may preferably be a zinc ion, copper ion, nickel ion or the like.

Further, it is described that a biline derivative, phlorin derivative, chlorin derivative or the like is also usable besides the biladienone derivative and that as a metal, another representative element or transition metal is also usable.

Patent Document 5 entitled "Linear Tetrapyrrole Dye" and to be described subsequently herein contains a description about a near tetrapyrrole dye primarily characterized in that it is synthesized by oxidizing and cleaving a tetraphenylporphyrin compound containing an alkyl or alkoxy group on each phenyl group.

In addition, Patent Document 6 entitled "Functional Molecular Element, Method for Producing Functional Molecular Element, and Functional Molecular Device" and to be described subsequently herein contains descriptions as will be described hereinafter.

The invention of Patent Document 6 relates to a functional molecular element in which π-electron conjugated molecules, each of which has a skeleton having a planar or substantially planar structure of a π-electron conjugated system and has side chains bonded to the skeleton, are adsorbed at the side chains thereof on electrodes to form adsorbed molecules arranged such that the planar or substantially planar structures of the skeletons lie substantially in parallel to the electrodes, and a structure formed of at least the adsorbed molecules and the electrodes has a function to pass a current in a direction intersecting the planar or substantially planar structure; and also to its fabrication process, that is, a process for fabricating the functional molecular element, which includes a step of preparing a solution of the π-electron conjugated molecules at an adjusted concentration, a step of bringing the solution into contact with the electrodes, and a step of evaporating the solvent from the solution such that the π-electron conjugated molecules are formed in layers stacked between surfaces of the electrodes as many as corresponding to the concentration.

The invention of Patent Document 6 also relates to a functional molecular device in which the structure constituting the functional molecular element has mutually-opposing electrodes as the electrodes.

PRIOR ART DOCUMENTS

Patent Documents

[Patent Document 1]
U.S. Pat. No. 6,256,767 (ABSTRACT)
[Patent Document 2]
U.S. Pat. No. 6,128,214
[Patent Document 3]
Japanese Patent Laid-open No. 2004-266100 (Paragraph 0008, Paragraphs 0159-0173)
[Patent Document 4]
Japanese Patent Laid-open No. 2005-228773 (Paragraphs 0031-0043)
[Patent Document 5]
Japanese Patent Laid-open No. 2006-283014 (Paragraphs 0006-0024)
[Patent Document 6]
Japanese Patent Laid-open No. 2006-351623 (Paragraphs 0037-0038)

Non-Patent Documents

[Non-Patent Document 1]
J. Chen, M. A. Reed, A. M. Rawlett and J. M. Tour, "Large on-off ratios and negative differential resistance in a molecular electronic device," Science, 286, 1552 to 1551 (1999)
[Non-Patent Document 2]
"Molecular Switches" compiled by Ben L. Feringa, WILEY-VCH, Weinheim (2001)
[Non-Patent Document 3]
M. A. Reed, C. Zhou, C. J. Muller, T. P. Burgin and J. M. Tour, "Conductance of a molecular junction," Science, 278, 252-254 (1997)
[Non-Patent Document 4]
J. M. Wessels, H. G. Nothofer, W. E. Ford, F. von Wrochem, F. Scholz, T. Vossmeyer, A. Schroedter, H. Weller and A. Yasuda, "Optical and electrical properties of three-dimensional interlinked gold nanoparticle assemblies," Journal of the American Chemical Society, 126(10), 3349-3356, (Mar. 17, 2004)

SUMMARY

Technical Problem

In many of the conventional molecular elements driven by an electric field, their molecules change in electronic state under the effect of the electric field, and as a result, the conductivity between two (or more) electrodes changes. In the case of an organic field effect transistor (organic FET), for example, the movement of carriers through organic molecules in a channel region is modulated by a change in an electric field acting on the organic molecules. The contact resistance at an interface between each electrode and its associated organic molecule is very large, and strongly affects the operating characteristics of the molecular element.

In each molecular element irrespective of its operating principle and including a functional molecular element based on the principle that under the effect of an electric field, it is changed in molecular structure to function as a molecular switch that turns on or off a current, the contact resistance at the interface between each electrode and its associated molecule obviously affects the operating characteristics of the molecular element where the contact resistance is large. Even in the case of the arrangement of organic molecule layers between mutually-opposing electrodes for allowing electrons to flow as in a solar cell, it is required to reduce the contact resistance as much as possible at the interface between each of the electrodes and its associated organic molecule.

In molecular elements, metal electrodes have been used in general. With a molecular element having two electrodes formed, for example, from gold with a gap of nanometer scale therebetween and organic molecules arranged in the electrode gap to form a channel, it is, however, considered difficult to achieve stable operation because the migration of gold atoms from surfaces of the electrodes or the formation of filaments with such gold atoms may occur under electric fields.

With a view to providing a solution to the above-described problem, the present invention has as its objects the provision of a functional molecular element provided at an interface between each electrode and its associated organic molecule with a reduced contact resistance, its fabrication process, and a functional molecular device.

Technical Solution

Described specifically, the present invention relates to a functional molecular element including electrodes (for example, electrodes 5, 6 in embodiments to be described subsequently herein), first π-electron conjugated molecules (for example, interface modifier molecules 2 in the embodiments to be descried subsequently herein), each of which has a first skeleton (for example, a nearly discoid skeleton 3 in the embodiments to be described subsequently herein) having a plane or substantial plane of a π-electron conjugated system and has side chains (for example, side chains 4 in the embodiments to be described subsequently herein) bonded to the first skeleton, the first skeletons of said first π-electron conjugated molecules being arranged substantially in parallel to the electrodes and being coupled at the side chains thereof to the electrodes, respectively, through covalent bonds, and a molecular array structure formed of the first π-electron conjugated molecules and second π-electron conjugated molecules (for example, driver molecules 1 in the embodiments to be described subsequently herein) stacked together such that the functional molecular element is provided with a function to pass a current in a direction intersecting with the planes of the first skeletons.

The present invention also relates to a process for fabricating a functional molecular element, including a first step of covalently bonding first π-electron conjugated molecules (for example, the interface modifier molecules 2 in the embodiments to be described subsequently herein), each of which has a first skeleton (for example, the nearly discoid skeleton 3 in the embodiments to be described subsequently herein) having a plane or substantial plane of a π-electron conjugated system and has side chains (for example, the side chains 4 in the embodiments to be described subsequently herein) bonded to the first skeleton, at the side chains thereof to electrodes (for example, the electrodes 5, 6 in the embodiments to be described subsequently herein) such that the first skeletons are arranged substantially in parallel to the electrodes, and a second step of stacking second π-electron conjugated molecules (for example, the driver molecules 1 in the embodiments to be described subsequently herein), each of which has a second skeleton having a plane or substantial plane of a π-electron conjugated system, by intermolecular π-π stacking of the second skeletons on the first skeletons, and repeatedly stacking the second skeletons in one direction by intermolecular π-π stacking such that a molecular array structure is formed with the first and second π-electron conjugated molecules included therein.

The present invention also relates to a functional molecular device including mutually-opposing, first and second electrodes (for example, the electrodes 5, 6 in the embodiments to be described subsequently herein), first π-electron conjugated molecules (for example, the interface modifier molecules 2 in the embodiments to be described subsequently herein), each of which has a first skeleton (for example, the nearly discoid skeleton 3 in the embodiments to be described subsequently herein) having a plane or substantial plane of a π-electron conjugated system and has side chains (for example, the side chains 4 in the embodiments to be described subsequently herein) bonded to the first skeleton, the first skeletons of said first π-electron conjugated molecules being arranged substantially in parallel to the first and second electrodes and being coupled at the side chains thereof to the first and second electrodes, respectively, through covalent bonds, second π-electron conjugated molecules (for example, the driver molecules 1 in the embodiments to be described subsequently herein), each of which is provided with a second skeleton having a plane or substantial plane of a π-electron conjugated system, stacked by intermolecular π-π stacking of the second skeletons of the second π-electron conjugated molecules between the first skeletons, said second skeletons being repeatedly stacked in one direction by intermolecular π-π stacking, and a molecular array structure formed by the first and second π-electron conjugated molecules on the first electrode and the second electrode, whereby the functional molecular device is provided with a function to pass a current in the one direction.

Advantageous Effects

According to the functional molecular element of the present invention, each of the first π-electron conjugated molecules has the first skeleton having the plane or substantial plane of the π-electron conjugated system and also has side chains bonded to the first skeleton, the first skeletons of the first π-electron conjugated molecules are arranged substantially in parallel to the electrodes and are coupled at the side chains thereof to the electrodes, respectively, through covalent bonds, and the first π-electron conjugated molecules and second π-electron conjugated molecules are stacked together to form the molecular array structure. Therefore, the first π-electron conjugated molecules take the structure that they are coupled to the electrodes, respectively, the π-electrons of the first π-electron conjugated molecules have a good electrical interaction with the electrodes, and the interface between each of the electrodes and its associated first π-electron conjugated molecule can be provided with a reduced contact resistance. Accordingly, the functional molecular element can effectively pass a current in the direction intersecting with the planes of the first skeletons.

According to the process of the present invention for fabricating the functional molecular element, the process includes the first step of covalently bonding the first π-electron conjugated molecules, each of which has the first skeleton having the plane or substantial plane of the π-electron conjugated system and has the side chains bonded to the first skeleton, at the side chains thereof to the electrodes such that the first skeletons are arranged substantially in parallel to the electrodes, and the second step of stacking the second π-electron conjugated molecules, each of which has the second skeleton having the plane or substantial plane of the π-electron conjugated system, by the intermolecular π-π stacking of the second skeletons on the first skeletons, and repeatedly stacking the second skeletons in the one direction by intermolecular π-π stacking such that a molecular array structure is formed with the first and second π-electron conjugated molecules included therein. Therefore, the first π-electron conjugated molecules are coupled to the electrodes, respectively, the π-electrons of the first π-electron conjugated molecules have a good electrical interaction with the first and second electrodes, and the interface between each of the first and second electrodes and its associated first π-electron conjugated molecule can be provided with a reduced contact resistance. Accordingly, the fabrication process can provide the functional molecular element that can effectively pass a current through the molecular array structure.

According to the functional molecular device of the present invention, the functional molecular device includes the mutually-opposing, first and second electrodes, the first π-electron conjugated molecules, each of which has the first skeleton having the plane or substantial plane of the π-electron conjugated system and has the side chains bonded to the first skeleton, the first skeletons of said first π-electron conjugated molecules being arranged substantially in parallel to the first and second electrodes and being coupled at the side chains thereof to the first and second electrodes, respectively, through covalent bonds, the second π-electron conjugated molecules, each of which is provided with the second skeleton having the plane or substantial plane of the π-electron conjugated system, stacked by the intermolecular π-π stacking of the second skeletons of the second π-electron conjugated molecules on the first skeletons, said second skeletons being repeatedly stacked in the one direction by intermolecular π-π stacking, and the molecular array structure formed by the first and second π-electron conjugated molecules between the first electrode and the second electrode. Therefore, the first π-electron conjugated molecules are coupled to the electrodes, respectively, the π-electrons of the first π-electron conjugated molecules have a good electrical interaction with the first and second electrodes, and the interface between each of the first and second electrodes and its associated first π-electron conjugated molecule can be provided with a reduced contact resistance. Accordingly, the functional molecular device can effectively pass a current in the one direction through the molecular array structure.

Additional features and advantages of the present invention are described in, and will be apparent from, the following Detailed Description and the Figures.

DETAILED DESCRIPTION

Figure 1:
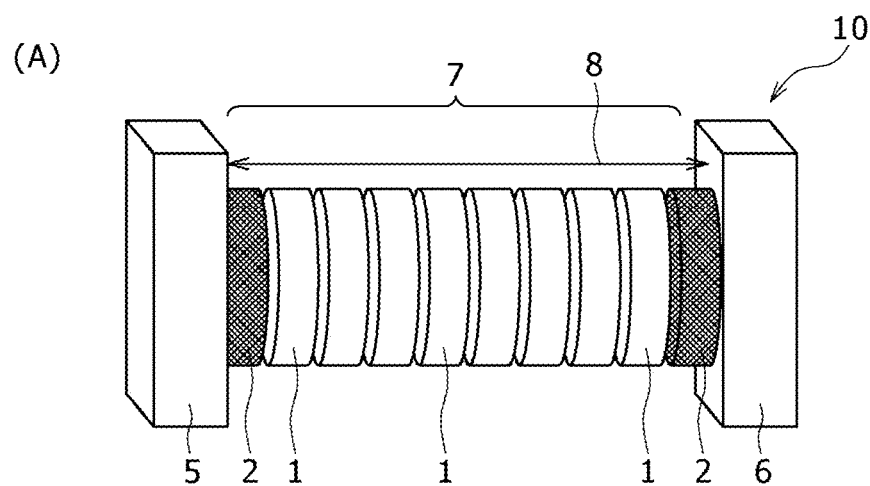
FIG. 1 are diagrams illustrating one example of functional molecular element according to an embodiment of the present invention.
Figure 1:
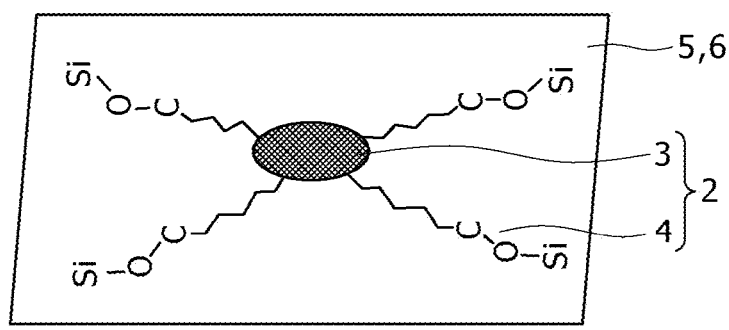
Figure 1:
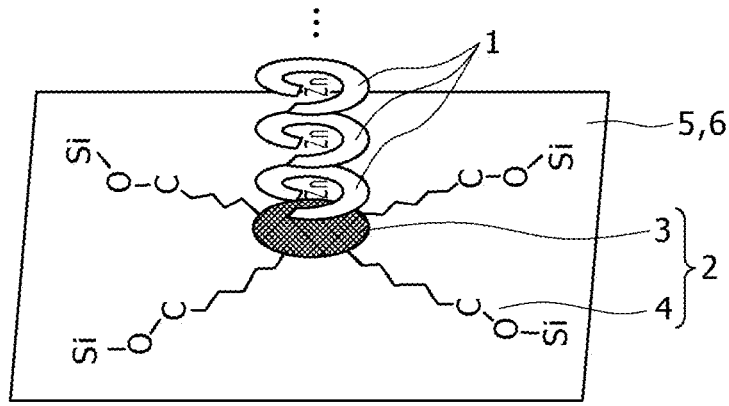

The functional molecular element according to the present invention may preferably be constructed such that the second π-electron conjugated molecules are each provided with a second skeleton having a plane or substantial plane of a π-electron conjugated system, the second skeletons of the second π-electron conjugated molecules are stacked on the first skeletons by intermolecular π-π stacking, the second skeletons are repeatedly stacked together in one direction by intermolecular π-π stacking, and the molecular array structure is formed of the first and second π-electron conjugated molecules such that the functional molecular element is provided with a function to pass a current in the one direction. According to this constitution, the molecular array structure has been by the intermolecular π-π stacking between the first and second π-electron conjugated molecules and also between the second π-electron conjugated molecules. The functional molecular element can, therefore, effectively pass a current in the one direction based on interaction between the π-electrons of the π-electron conjugated molecules.

Also, the first π-electron conjugated molecules may preferably be different in species from the second π-electron conjugated molecules. According to this constitution, the first and second π-electron conjugated molecules can be selected such that the first π-electron conjugated molecules can be coupled to the electrodes, respectively, the electrical interaction between the π-electrons of the first π-electron conjugated molecules and the corresponding electrodes can be improved to reduce the contact resistance between the electrodes and their associated first π-electron conjugated molecules, and further, the intermolecular π-π stacking between the first and second π-electron conjugated molecules and the intermolecular π-π stacking between the second π-electron conjugated molecules can be improved.

Also, the electrodes may preferably be formed of polysilicon (hereinafter abbreviated as "pSi") or amorphous silicon (hereinafter abbreviated as "aSi"). According to this constitution, the electrodes can be formed at low cost. When the electrodes include electrodes opposing each other with a gap of nanometer scale therebetween and formed of metal electrodes (for example, gold electrodes), the migration of electrode-forming atoms from surfaces of the electrodes or the formation of filaments with such atoms may occur under electric fields between the electrodes. With the electrodes formed of pSi or aSi, however, the migration of atoms or the formation of filaments does not occur even when the electrodes include electrodes opposing each other with a gap of nanometer scale therebetween. It is, therefore, possible to realize a molecular element of nanometer scale, which has electrodes with a gap of nanometer scale therebetween and can stably operate.

Also, the functional molecular element has, as the electrodes, first and second electrodes opposing each other, the side chains of the first π-electron conjugated molecules are coupled to the first and second electrodes, respectively, through covalent bonds, and the molecular array structure is formed between the first electrode and the second electrode. According to this constitution, the first π-electron conjugated molecules can be coupled to the electrodes, respectively, the electrical interaction between the π-electrons of the first π-electron conjugated molecules and the first and second electrodes can be improved to reduce the contact resistance at the interface between each of the first and second electrodes and its associated first π-electron conjugated molecule, and the functional molecular element can effectively pass a current along the one direction through the molecular array structure.

Also, the electrodes further include a third electrode such that the current can be controlled by the third electrode. According to this constitution, the contact resistance between the first and second electrodes and the molecular array structure is small. By controlling the conductivity of the molecular array structure based on a change in an electric field applied to the third electrode, it is possible to realize a molecular element that has a switching function.

Also, the first π-electron conjugated molecules may preferably be those of a tetrapyrrole derivative, a phthalocyanine derivative, or a fused polycyclic aromatic compound having three or more rings. The thickness of a conduction path of a conductive polymer, in which π-electrons are delocalized on a linear chain as typified by polypyrrole or the like, approximately depends on its ring diameter. Specifically, the thickness is 0.5 nm or so in radius. On the other hand, the delocalized plane of the π-electrons of a tetrapyrrole derivative is 1 nm or so in radius, and the conduction path of the π-π stacking has an area as large as approximately 4 times the area of a conduction path of the above-mentioned general conductive polymer. By accurately controlling the distance between each electrode plane and its associated first π-electron conjugated molecule, for example, the delocalized plane of the π-electrons of the tetrapyrrole derivative, the overlapping of electronic state densities can be controlled, thereby making it possible to increase the transmission coefficient of electrons from the electrode to its associated first π-electron conjugated molecule.

Further, the first electron conjugated molecules may preferably be those of a porphyrin derivative or a coronene derivative.

The first π-electron conjugated molecules may preferably be those of a tetraphenylporphyrin derivative represented by the following formula (1) wherein $R^1$, $R^2$, $R^3$ and $R^4$ may be the same or different and each represent a hydroxyl group or a substituted, linear hydrocarbon group.

[Formula 1]

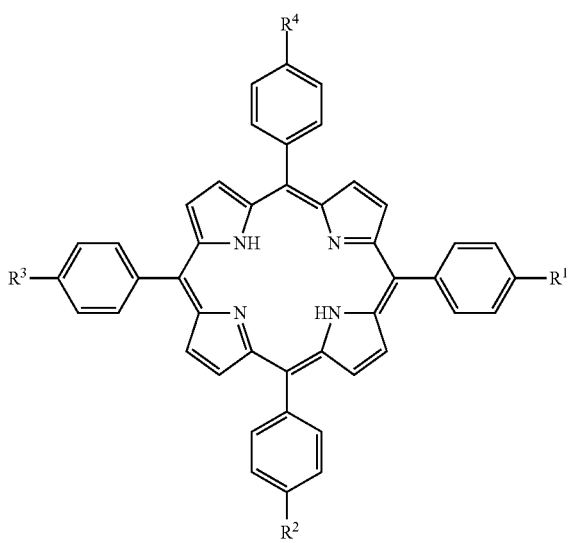

According to this constitution, the inclusion of from 1 to 12 carbon atoms in each linear hydrocarbon group, for example, each alkyl group can make the first π-electron conjugated molecules suitably orient on the associated electrodes without distortion of the delocalized planes of their π-electrons, can covalently couple the first π-electron conjugated molecules to the electrodes, respectively, at their side chains, and can facilitate the synthesis of the functional molecular element. Instead of the alkyl group, the linear hydrocarbon group may also be an alkenyl group or alkynyl group. Preferably, $R^1$, $R^2$, $R^3$ and $R^4$ may be the same or different and each represent a linear hydrocarbon group with its terminal hydrogen group being substituted by a hydroxyl group (—OH), a vinyl group (—CH=$CH_2$) or an ethynyl group (—C≡CH). Those capable of forming covalent bonds with their associated electrodes, for example, silicon electrodes (which can be native silicon-oxide film electrodes) are desired to couple the first π-electron conjugated molecules to the electrodes, respectively. The tetraphenylporphyrin derivative represented by the formula (1) has an in-plane π-electron delocalization property the HOMO level of which is close to the Fermi level of the electrodes, for example, silicon electrodes, and therefore, is suited as interface modifier molecules for modifying the surfaces of the electrodes. It is to be noted that compounds represented by the formula (1) are called "tetraphenylporphyrins."

Preferably, the side chains may each be an alkyl group, an alkoxy group, a silicon analog of an alkyl group, or an aromatic group with an alkyl group, an alkoxy group or a silicon analog of an alkyl group bonded thereto. According to this constitution, the first π-electron conjugated molecules can be coupled at their side chains to the electrodes, respectively, whichever the side chains are. It is to be noted that the alkyl group, the alkoxy group and the silicon analog of the alkyl group are groups represented by —$C_nH_{2n+1}$, —$OC_nH_{2n+1}$ and —$Si_nH_{2n+1}$, respectively. One or more of the hydrogen atoms (H) in the silicon analog may be substituted by a like number of alkyl group(s) or alkoxy group(s).

The second π-electron conjugated molecules may preferably be those of a porphyrin derivative or a linear tetrapyrrole. According to this constitution, the molecular array structure formed of the first and second π-electron conjugated molecules exhibits good on (good conductivity)/off switching characteristics depending on the existence or non-existence of an electric field applied to the molecular array structure, and therefore, a transistor or the like can be fabricated. The second π-electron conjugated molecules may be of those of a complex having a metal ion approximately at its center.

Preferably, the second π-electron conjugated molecules may also be those of a biladienone derivative represented by the following formula (2) wherein $R^5$, $R^6$, $R^7$ and $R^8$ may be the same or different and each represent an alkyl group having from 3 to 12 carbon atoms.

[Formula 2]

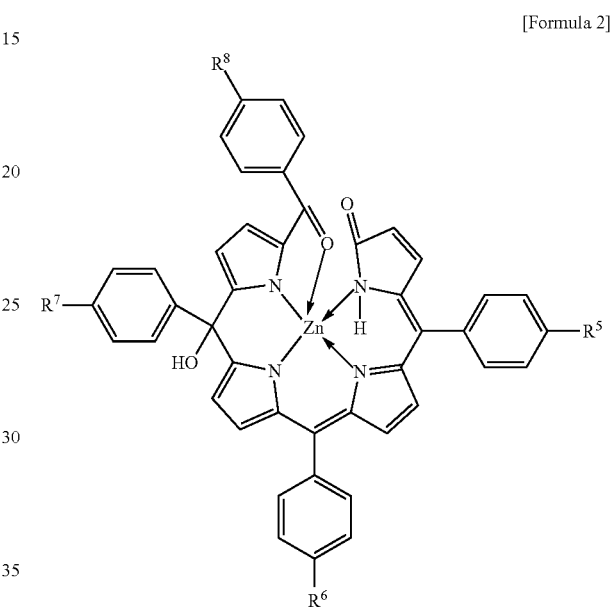

According to this constitution, a dipole moment is applied by an external electric field so that the delocalized plane of the π-electron conjugated system of each second π-electron conjugated molecule is modulated. The second π-electron conjugated molecules can therefore act as a molecular switch control element. To allow the second π-electron conjugated molecules to orient through self-organization by making use of their π-π stacking interaction with the first π-electron conjugated molecules, the second π-electron conjugated molecules may desirably form a discotic liquid crystal phase. Even when no liquid crystal phase is formed, it is still preferred for the second π-electron conjugated molecules to have flexible side chains.

In the process of the present invention for the fabrication of the functional molecular element, the first π-electron conjugated molecules may preferably be different in species from the second π-electron conjugated molecules. According to this constitution, the first and second π-electron conjugated molecules can be selected such that the first π-electron conjugated molecules can be coupled to the first and second electrodes, respectively, the electrical interaction between the π-electrons of the first π-electron conjugated molecules and the corresponding first and second electrodes can be improved to reduce the contact resistance at the interface between each of the first and second electrodes and its associated first π-electron conjugated molecule, and further, the intermolecular π-π stacking between the first and second π-electron conjugated molecules and the intermolecular π-π stacking between the second π-electron conjugated molecules can be improved. The fabricated functional molecular element can, therefore, exhibit excellent performance.

In the functional molecular device according to the present invention, the first π-electron conjugated molecules may preferably be different in species from the second π-electron conjugated molecules. According to this constitution, the first and second π-electron conjugated molecules can be selected such that the first π-electron conjugated molecules can be coupled to the first and second electrodes, respectively, the electrical interaction between the π-electrons of the first π-electron conjugated molecules and the corresponding first and second electrodes can be improved to reduce the contact resistance at the interface between each of the first and second electrodes and its associated first π-electron conjugated molecule, and further, the intermolecular π-π stacking between the first and second π-electron conjugated molecules and the intermolecular π-π stacking between the second π-electron conjugated molecules can be improved. The functional molecular device can, therefore, exhibit excellent performance.

The first and second electrodes may preferably be formed of polysilicon or amorphous silicon. According to this constitution, the electrodes can be formed at low cost. When the electrodes include electrodes opposing each other with a gap of nanometer scale therebetween and formed of metal electrodes (for example, gold electrodes), the migration of electrode-forming atoms from surfaces of the electrodes or the formation of filaments with such atoms may occur under electric fields between the electrodes. With the electrodes formed of pSi or aSi, however, the migration of atoms or the formation of filaments does not occur even when the electrodes include electrodes opposing each other with a gap of nanometer scale therebetween. It is, therefore, possible to realize a molecular element device of nanometer scale, which has electrodes with a gap of nanometer scale therebetween and can stably operate.

The functional molecular device may preferably further include a third electrode such that the current can be controlled by the third electrode. According to this constitution, the contact resistances between the first and second electrodes and the molecular array structure are small. By controlling the conductivity of the molecular array structure based on a change in an electric field to be applied to the third electrode, it is possible to realize a molecular element device that has a switching function.

It is preferred that the third electrode is arranged along the one direction as a control electrode for applying an electric field to the molecular array structure and controlling the current. According to this constitution, the molecular element device can be constructed as a field effect transistor.

Preferably, the third electrode may be a gate electrode, a gate insulating layer may be arranged on the gate electrode, and the first electrode and second electrode may be formed as a source electrode and a drain electrode, respectively, on the gate insulating layer such that the functional molecular device is constructed as an insulated-gate field effect transistor. According to this constitution, the contact resistances between the source electrode and drain electrode and the molecular array structure are small, so that the molecular element device can be constructed as a field effect transistor having excellent performance.

The functional molecular element according to the present invention is constructed of mutually-opposing, two electrodes formed of pSi (polysilicon) or aSi (amorphous silicon) and a molecular array structure. This molecular array structure is formed of interface modifier molecules, which are covalently coupled to the surfaces of the two electrodes to modify their surfaces, and driver molecules (functional molecules), which are repeatedly stacked in one direction on the interface modifier molecules by intermolecular π-π stacking. The interface modifier molecules each have a nearly discoid skeleton of a π-electron conjugated system and side chains, are arranged with planes of their skeletons lying substantially in parallel to the surfaces of the electrodes, and are covalently coupled at the side chains thereof to Si atoms in the electrodes, respectively.

The driver molecules are of a π-electron conjugated system, and upon application of an electrical field, change in structure or orientation and hence change in dielectric constant, in other words, conductivity. The driver molecules are functional molecules of a complex having a metal ion such as a Zn ion approximately at its center. The interface modifier molecules and driver molecules are stacked together by intermolecular π-π stacking, and so the driver molecules themselves. The direction of a current that flows through the molecular array structure is the direction in which the driver molecules are stacked. By arranging the interface modifier molecules between the driver molecules and the electrodes, respectively, and repeatedly stacking the driver molecules on the interface modifier molecules, the transport of electrons at the interface between each interface modifier molecule and its associated electrode can be made efficient so that the contact resistance between the interface modifier molecule and its associated electrode can be reduced. As a consequence, it is possible to effectively pass a current in the direction of stacking of the driver molecules, and a molecular array structure 7 can be formed with good reproducibility.

In addition to the above-described electrodes, a control electrode can be arranged along the direction of stacking of the driver molecules. By this control electrode, the direction and magnitude of a current to be passed through the molecular array structure can be controlled, thereby making it possible to construct the functional molecular element as a switching element. It is, however, to be noted that the functional molecular element according to the present invention is not limited to such an active element but can be a passive element such as, for example, a resistance element or wiring element useful as a resistance or wiring.

With reference to the accompanying drawings, embodiments of the present invention will hereinafter be described in detail.

First Embodiment

Construction of Functional Molecular Element

FIG. 1 are schematic diagrams illustrating one example of functional molecular element according to an embodiment of the present invention, in which FIG. 1(A) is a perspective diagram, FIG. 1(B) is a perspective diagram showing an interface modifier molecule covalently coupled to an electrode, and FIG. 1(C) is a perspective diagram depicting driver molecules stacked on the interface modifier molecule.

As illustrated in FIG. 1(A), the functional molecular 10 is constructed of mutually-opposing electrode (first electrode) 5 and electrode (second electrode) 6 formed of pSi or aSi and a molecular array structure 7 arranged between these electrodes 5, 6. The molecular array structure 7 is formed of interface modifier molecules (first π-electron conjugated molecules) 2 covalently coupled to surfaces of the electrodes 5, 6 and driver molecules (second π-electron conjugated molecules) 1 stacked in a columnar form on the interface modifier molecules 2.

The interface modifier molecules 2 are modifier molecules that modify the surfaces of the electrodes 5, 6. The driver molecules 1 are functional molecules, which upon application of an electric field, change in structure or orientation and hence change in dielectric constant, in other words, conductivity. A direction 8 of a current, which flows through the molecular array structure 7, is the direction of stacking of the driver molecules 1. The driver molecules 1 and interface modifier molecules 2 are the same or different π-electron conjugated molecules.

As shown in FIG. 1(B), each interface modifier molecule 2 has a nearly discoid skeleton (first skeleton) 3 of a π-electron conjugated system and side chains 4, is arranged such that a plane of the skeleton 3 lies substantially in parallel to the surfaces of the associated electrode 5 or 6, and is covalently coupled at the side chains 4 to Si atoms, which form the associated electrode 5 or 6, via —O— bonds. The interface modifier molecule 2 uses terminal groups of the side chains 4 as anchors. Through a reaction between these anchors and the surface of the associated electrode 5 or 6, the side chains 4 form covalent bonds with the surface of the associated electrode 5 or 6. Therefore, the interface modifier molecule 2 is arranged such that the plane of its skeleton 3 lies substantially in parallel to the surface of the associated electrode 5 or 6, and the interface modifier molecule 2 modifies the surface of the associated electrode 5 or 6.

As depicted in FIG. 1(C), each driver molecule 1 is that of a complex having Zn (ion) approximately at its center, and has a substantially planar skeleton (second skeleton) of a π-electron conjugated system. The skeletons of the respective driver molecules 1 are stacked in a columnar form on the skeleton 3 by intermolecular π-π stacking. Specifically, the lowermost driver molecule 1 is stacked on the interface modifier molecule 1. On the driver molecule 1 stacked on the interface modifier molecule 2, the skeletons of the remaining driver molecules 1 are repeatedly stacked further one over the other in one direction by intermolecular π-π stacking. In other words, the driver molecules 1 are repeated stacked one over the other, and between the electrodes 5, 6 such that a molecular array structure 7 is formed by the interface modifier molecules 2 and driver molecules 1. The molecular array structure 7 has a function to pass a current in the direction of stacking of the driver molecules 1.

Each driver molecule 1 generally has side chains. In FIG. 1(C), however, these side chains are not shown, and each driver molecule 1 is schematically depicted by a washer-shaped open ring as the skeleton and Zn (ion) located approximately at its center (this applies equally to FIG. 2 and FIG. 3 to be described subsequently herein). The interface modifier molecules 2 are covalently coupled to the surfaces of the electrodes 5, 6, respectively, and are arranged such that their skeletons 3 lie substantially in parallel to the electrodes 5, 6. The π-electrons of the interface modifier molecules 2 and the electrodes 5, 6 have improved electrical interaction, and the interfaces between the interface modifier molecules 2 and the electrodes 5, 6 are provided with a reduced contact resistance.

As the lowermost driver molecule 1 is stacked on the interface modifier molecule 2 by intermolecular π-π stacking and the remaining plural driver molecules 1 are stacked further by intermolecular π-π stacking, the molecular array structure 7 can be formed in the one direction with good reproducibility. By the arrangement of the interface modifier molecules 2 between the driver molecules 1 and the electrodes 5, 6, electrons can be efficiently transported at the interfaces between the molecular array structure 7 and the electrodes 5, 6. A current is, therefore, allowed to efficiently flow in the direction of the stacking.

The functional molecular element shown in FIG. 1 may be formed into a construction that has an unillustrated control electrode (third electrode) arranged along the direction of stacking of the driver molecules 1. By this control electrode, it is possible to control the direction and magnitude of a current that flows through the molecular array structure 7. By using this control electrode as a gate electrode, arranging a gate insulating layer on the gate electrode, and using the electrode 5 as a source electrode and the electrode 6 as a drain electrode, the functional molecular element can be constructed as an insulated-gate field effect transistor.

No particular limitation is imposed on the interface modifier molecules 2 covalently coupled to the surfaces of the electrodes 5, 6 and modifying the surfaces, insofar as the driver molecules 1 can be stacked on them by intermolecular π-π stacking. As the interface modifier molecules 2, it is possible to use, for example, those of a porphyrin derivative having a ring that four pyrrole rings are linked at α-positions thereof alternately with four methine groups (a tetrapyrrole ring, which is a ring of closed structure called "a tetrapyrrole ring," "a porphyrin ring" or the like). Usable is, for example, a compound, which is a tetraphenylporphyrin derivative having phenyl groups bonded to the carbon (C) atoms of the four methine groups, respectively, and having a structure that one or more hydrogen (H) atoms of each of these phenyl groups have been substituted by a long-chain substituent group.

Upon application of an electric field, the driver molecules 1 change in structure or orientation, and hence change in dielectric constant, in other words, conductivity. The driver molecules 1 are stacked in one direction by their interaction. The driver molecules 1 are also needed to be stacked on the interface modifier molecules 2 by intermolecular π-π stacking. Usable examples of the driver molecules 1 are those of a linear tetrapyrrole having a structure that the ring of the above-described porphyrin derivative (tetrapyrrole ring) is cleaved at the linkage of the methine group between specific two of the pyrrole rings.

<Fabrication Process of Functional Molecular Element>

Figure 2:
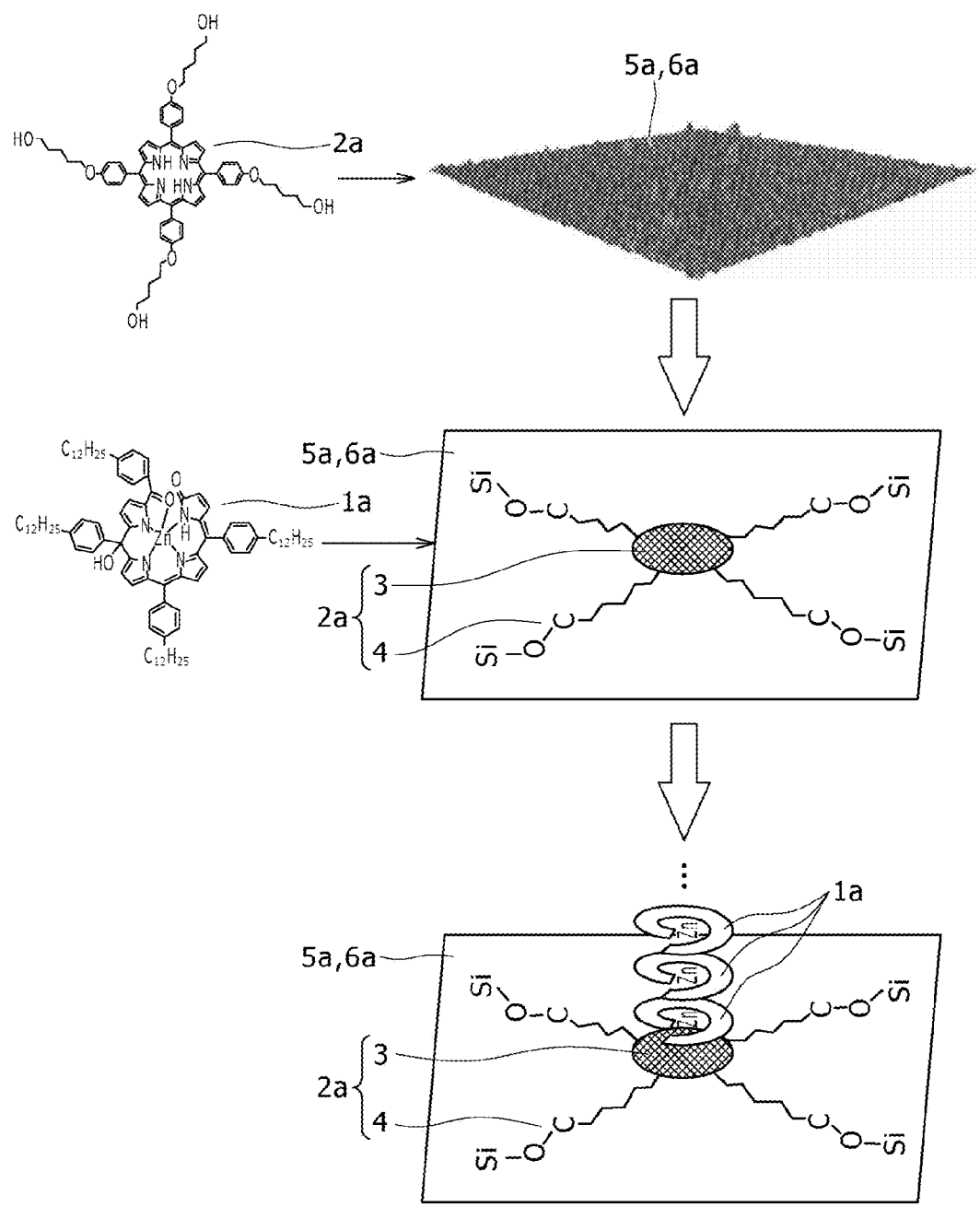
FIG. 2 is a diagram illustrating a process according to another embodiment of the present invention for the fabrication of a functional molecular element.

FIG. 2 is a diagram illustrating a process according to another embodiment of the present invention for the fabrication of a functional molecular element.

The fabrication process of the functional molecular element includes a step of coupling interface modifier molecules to electrode surfaces through covalent bonds and another step of stacking functional molecules in one direction on the interface modifier molecules coupled to the electrode surfaces.

As illustrated by way of example in the top figure of FIG. 2, an interface modifier molecule 2a (see the left part of the top figure of FIG. 2) is covalently coupled to an electrode 5a or 6b (in the right part of the top figure of FIG. 2, a pSi electrode shown in FIG. 5(B) to be described subsequently herein is shown). The interface modifier molecule 2a is a π-electron conjugated molecule of a porphyrin derivative (tetraphenylporphyrin derivative) having a structure that has a tetrapyrrole ring as a skeleton 3 with side chains 4 of —($C_6H_4$)O($CH_2$)$_5$OH being bonded to the carbon atoms of the methine groups between the pyrrole rings. (The interface modifier molecule 2a is one example of the above-mentioned tetraphenylporphyrin derivative, and is a compound shown in FIG. 4(D) to be described subsequently herein.) At this stage, the skeleton 3 formed of the tetrapyrrole ring lie substantially in parallel to the electrode 5 or 6.

In the following description, the above-described porphyrin derivative of the structure that the side chains 4 of —($C_6H_4$)O($CH_2$)$_5$OH are bonded to the respective carbon atoms of the four methine groups and the hydrogen-terminated silicon will be represented by the abbreviations "Por-OH" and "Si—H," respectively, as shown in FIG. 4(D).

With respect to the electrodes 5, 6 formed of the pSi electrodes, the removal of surface oxide films and the hydrogen termination of the surfaces were conducted beforehand by treating the electrodes for two minutes at room temperature in a 5% aqueous solution of HF, washing them with purified water and then washing them with isopropyl alcohol. Hydrogen atoms are extracted from the hydrogen-terminated silicon to form silicon radicals, and the silicon radicals and the porphyrin derivative Por-OH are coupled together through covalent bonds. The formation of the radicals can be effected, for example, by heating.

By the above-described reaction [Por-OH+Si—H→Por-O—Si+H$_2$] between the porphyrin derivative (Por-OH) and the hydrogen-terminated silicon (Si—H), the interface modifier molecules 2a are covalently coupled to the electrodes 5a, 6b. As a result, the electrodes surface-modified with Por-OH, Por-OH/Si, are formed (the right part of the middle figure of FIG. 2).

Each surface modifier molecule 2a has the structure that the side chains of p-alkylphenyl groups are bonded to the skeleton. The skeleton forms a rigid, substantially-planar structure (porphyrin-like, nearly discoid structure) of a π-electron conjugated system, and its side chains form a flexible chain structure owing to intramolecular rotation about C-C axes.

The number of carbon atoms in the carbon chain in each side chain formed of the p-alkylphenyl group may be from 3 to 12. Examples of the carbon chain in the side chain formed of the p-alkylphenyl group include from $(CH_2)_{10}OH$ to $(CH_2)_{12}OH$. With carbon chains of such a carbon number, the interface modifier molecules 2a are well-oriented and covalently coupled to the associated electrodes without crystallization, and the synthesis of the functional molecular element can be facilitated. A carbon number of 1 or 2, on the other hand, renders the interface modifier molecules 2a more prone to crystallization so that the interface modifier molecules 2a do not exhibit liquid-crystalline physical properties and tend to undergo poor orientation. A carbon number of 13 or greater, on the other hand, conversely renders the interface modifier molecules 2a hard to orient, and also renders difficult the synthesis of the functional molecular element.

The electrodes 5, 6 of the pSi electrodes was terminated with halogen atoms beforehand. As an alternative, halogen atoms can be extracted from the halogen-terminated silicon to form silicon radicals, and the silicon radicals and the interface modifier molecules 2a can be coupled together through covalent bonds. For the formation of the radicals, another method such as the charging of a reaction initiator or the irradiation of light may also be employed instead of the heating method.

The electrodes 5, 6 are not limited to those formed of the pSi electrodes, but electrodes formed from carbon, silicon nitride, germanium or the like can be also used. Insofar as these electrodes have been hydrogen-terminated or halogen-terminated beforehand, they can be covalently coupled to the interface modifier molecules at their side chains like the pSi electrodes.

As illustrated in the middle figure of FIG. 2, driver molecules 1a (the left part of the middle figure of FIG. 2) are then stacked by intermolecular π-π stacking in a columnar form through self-stacking on the interface modifier molecule 2a covalently coupled to the electrode 5a or 6b. Each driver molecule 1a is a π-electron conjugated molecule ($C_{12}H_{25}$-biladienone Zn complex) having a linear structure that a tetrapyrrole ring of a porphyrin derivative, which is a complex having the tetrapyrrole ring as a skeleton, containing —$(C_6H_4)$ $(CH_2)_{11}CH_3$ bonded to the carbon atoms in the respective methine groups between the every two pyrrole rings and having a Zn (ion) approximately at the center, is cleaved at the linkage of the methine group between specific two of the pyrrole rings (this driver molecule 1a is that of the compound shown in FIG. 4(G) to be described subsequently herein, and this compound will hereinafter be called "$C_{12}H_{25}$-biladienone Zn complex").

Described specifically, the driver molecule 1a has a skeleton formed of four pyrrole rings linked together in series via methine groups, and is a molecule of one called an acyclic pyrrole, a ring-opened or open circular tetrapyrrole or a linear tetrapyrrole. Therefore, the driver molecule 1a is a molecule of a compound, which can be regarded as a linear tetrapyrrole formed by cleavage of a tetraphenylporphyrin derivative having a structure that the hydrogen (H) atoms of the phenyl groups have been replaced by $(CH_2)_{11}CH_3$, respectively.

The skeleton of the driver molecule 1a contains as its basic structure the structure of biladienone (4,9-biladien-1-one), which is a kind of linear tetrapyrrole having a structure corresponding to a opened porphyrin ring.

As depicted in the bottom figure of FIG. 2, the skeleton of the lowermost driver molecule 1a is stacked on the skeleton 3 of the interface modifier molecule 2a by intermolecular π-π stacking, and further, the skeletons of the driver molecules 1a are stacked one over the other in one direction by intermolecular π-π stacking, whereby the molecular array structure 7 shown in FIG. 1 is formed between the electrodes 5a, 6b.

A π-electron conjugated molecule like each driver molecule 2a, which makes up the molecular array structure 7, changes in structure or orientation upon application of an electric field. As a result, a structural change occurs in a region where a complex is formed with a metal ion such as Zn ion contained approximately at the center, and hence, the driver molecule (functional molecule) is caused to change in dielectric constant, in other words, conductivity.

In a π-electron conjugated molecule like each driver molecule 2a, the molecule presents a structure twisted from a plane because of the existence of mutually-opposing, end C=O groups (carbonyl groups), and moreover, π-π stack structures are formed between plural molecules so that a helix is formed to present a helical structure. This helical structure is formed of an optical isomer, which is either an M-form (minus form) in which the helix advances through left-hand turns or a P-form (plus form) in which the helix advances through right-hand turns. The pitch of the helix of this helical structure changes depending on the conditions of an electrical field that acts on the driver molecules.

The zinc ion approximately at the center of the porphyrin-like, nearly discoid structure is not absolutely necessary, but is useful for the functional molecular element to exhibit switching characteristics because the molecular array structure exhibits on (good conductivity)/off switching characteristics depending on the existence or non-existence of an electric field applied to the molecular array structure. A metal ion of a transition element or typical element, such as a copper ion or nickel ion, can also be used instead of the zinc ion.

It is known that, when a molecular array structure is formed with π-electron conjugated molecules each having a rigid discoid or nearly discoid skeleton, the discoid or nearly discoid skeletons of the respective molecules stack one over the other in a parallel, face-to-face opposing relationship by π-π electron interaction and the π-electrons are delocalized between the stacked skeletons. Especially in the case of molecules each having long alkyl chains of 6 or more carbon atoms as side chains (like discotic liquid-crystals), the π-electron conjugated molecules are stacked in a columnar form to exhibit high conductivity in the direction of the stacking (see Yo Shimizu, T. Higashiyama and T. Fuchita, "Photoconduction of a mesogenic long-chain tetraphenylporphyrin in a symmetrical sandwich-type cell," Thin Solid Films, 331 (1998), 279-284).

It is reported that a metal ion may coordinate approximately at the center of a discoid or nearly discoid skeleton (see Yo Shimizu, "Photoconductivity of Discotic Liquid Crystals: a Mesogenic Long-Chain Tetraphenylporphyrin and Its Metal Complexes," Molecular Crystals and Liquid Crystals, 370 (2001), 83-91; S. T. Trzaska, H-F. Hsu and T. M. Swager, "Cooperative Chiralith in Columnar Liquid Crystals: Studies of Fluxional Octahedral Metallomesogens," J. Am. Chem. Soc., 121 (1999), 4518-4519; and Yo Shimizu, "Columnar Liquid Crystals and Their Diverse Molecular Structures and Intramolecular Action," Liquid Crystals, 6 (2002), 147-159).

As one example of functions of a molecular array structure formed by the π-π stacking of discoid or nearly discoid π-electron conjugated molecules such as porphyrin molecules, it is possible to consider a function as a pipe (channel chain) that allows electrons to flow in the direction of the stacking. Compared with an ordinary conductive chain molecule, it has a current path of larger diameter and hence allows a larger current to flow. The use of such molecular array structures as electron channels in solar cells is under active study.

When using the above-described molecular array structure as a conductor, however, it is necessary that as illustrated in FIG. 1(A), the direction of stacking of the molecular array structure 7 is brought into conformity with the direction 8 in which a current is desired to flow (the direction of connection of the electrodes 5 with the electrode 6) and the molecular array structure 7 is arranged to be coupled at the end portions of the molecular array structure 7 to the surfaces of the electrodes 5, 6, respectively, such that the contact resistances at the electrodes 5, 6 can be made small.

However, the use of molecules, each of which does not have side chains, as π-electron conjugated molecules for the formation of interface modifier molecules cannot control the orientation of the π-electron conjugated molecules relative to the surfaces of the electrodes or the direction of stacking of the molecules because there are no groups that are effective for controlling the state of the molecules on the surfaces of the electrodes such that the discoid planes of the skeletons can be selectively oriented in parallel to the surfaces of the electrodes. A problem, therefore, arises in that the direction of conduction of the resulting molecular array structure cannot be controlled to a direction in which a current is desired to flow or can be hardly held in such a direction and, even if the molecular array structure itself has high conductivity, the high conductivity cannot be utilized. In addition, there is another problem in that, unless the distance between the discoid plane of the skeleton of the π-electron conjugated molecule at each end of the molecular array structure and the surface of the associated electrode is from 0.34 nm to 0.36 nm or is smaller, the delocalization of electrons at the interfaces between the π-electron conjugated molecules and the electrodes cannot be achieved, and hence, no small contact resistances can be realized at the interfaces.

To resolve the above-described problems, this embodiment first forms the π-electron conjugated molecule, which has the flexible side chains 4, as a monomolecular layer covalently coupled to the surface of the electrode so that the surface modifier molecule is arranged on the surface of the electrode. On the surface modifier molecule, the remaining π-electron conjugated molecules are stacked as driver molecules by π-π stacking to form the molecular array structure.

No particular limitation is imposed on the driver molecules to be stacked, insofar as they can form a π-π stack on the interface modifier molecule. In this embodiment, the driver molecules and the interface modifier molecules have been described, by way of example, as being different in species from each other. They may, however, be π-electron conjugated molecules of the same species.

The interface modifier molecules, which form the monomolecular layers as first layers on the opposite ends of the molecular array structure, are covalently coupled at the flexible side chains thereof to the surfaces of the associated electrodes, and as a result, are arranged such that their skeletons come into close, substantially parallel contact with the surfaces of the associated electrodes. As a consequence, the π-electrons of the skeletons can be delocalized on the electrodes to minimize the contact resistances at the interfaces between the molecular array structure and the electrodes.

The direction of stacking of the second and further molecule layers from the opposite ends of the molecular array structure is controlled by π-π interactions such that, by using as bases the nearly discoid planes of the skeletons of the interface modifier molecules arranged in parallel to the surfaces of the electrodes, the nearly discoid plane of the skeleton of each upper-layer driver molecule lies substantially in parallel and on the nearly discoid plane of the skeleton of its lower-layer driver molecule. The molecular array structure can, therefore, effectively pass a current in the direction of the stacking owing to the interaction between the π-electrons.

In the manner as described above, it is possible to improve the robustness of coupling at interfaces with electrodes, to make very small the contact resistances at the interfaces, to control the stacking direction of a molecular array structure (the direction in which a current is allowed to flow), and to obtain stable characteristics. A rigid functional molecular element can be obtained accordingly.

Second Embodiment

Construction of Insulated-Gate Field Effect Transistor

In the second embodiment, a description will be made about a functional molecular device in which the functional molecular element 10 described in the first embodiment and having the mutually opposing electrodes was constructed as an insulated-gate field effect transistor.

Figure 3:
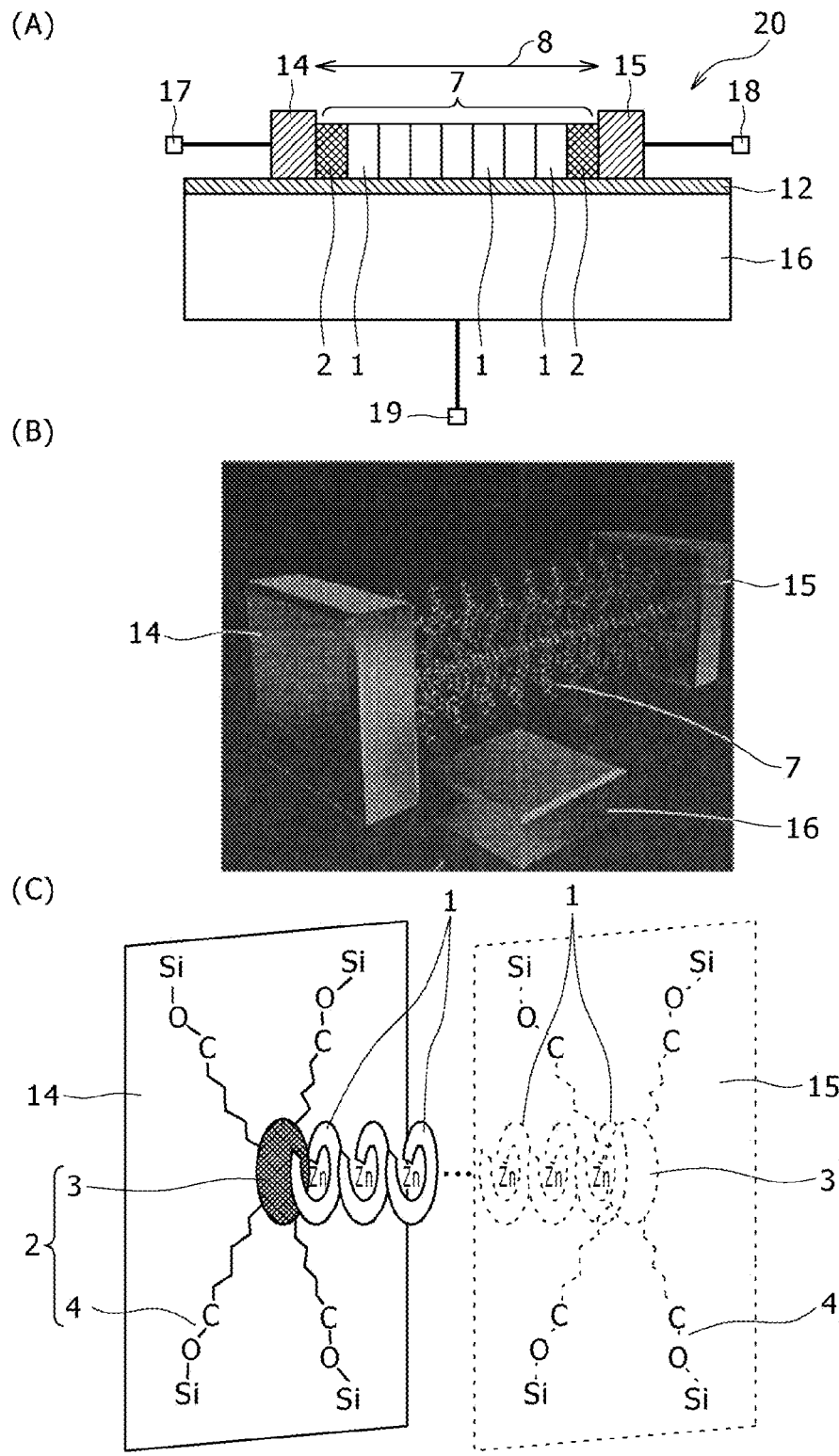
FIG. 3 are views and a diagram illustrating an insulated-gate field effect transistor according to a further embodiment of the present invention.

FIG. 3 are views and a diagram illustrating the insulated-gate field effect transistor according to the further embodiment of the present invention, in which FIG. 3(A) is a cross-sectional view, FIG. 3(B) is a perspective view, and FIG. 3(C) is a schematic diagram depicting the molecular array structure.

As shown in FIG. 3, a doped silicon substrate 16 also serves as a gate electrode, that is, a control electrode in the insulated-gate field effect transistor 20. On a surface of the silicon substrate 16, a silicon oxide layer is formed as a gate insulating film 12, and on the silicon oxide layer, source electrode 14 and drain electrode 15 made, for example, of pSi or aSi are formed as mutually-opposing electrodes. Between these electrodes, the molecular array structure 7 described in the first embodiment is arranged.

Corresponding to the source electrode 14, the drain electrode 15, and the silicon substrate 16 which also serves as the gate electrode, source electrode terminal 17, drain electrode terminal 18 and gate electrode terminal 19 are connected. It is to be noted that the source electrode 14, drain electrode 15 and silicon substrate 16 are shown in parts.

The interface modifier molecules 2 of π-electron conjugated molecules as the first layers on the opposite ends in the molecular array structure 7 are arranged at positions closest to the source electrode 14 and the drain electrode 15, respectively. The skeletons 3 of the interface modifier molecules 2 are in close contact with the source electrode 14 and drain electrode 15 such that their nearly discoid planes lie substantially in parallel to the source electrode 14 and drain electrode 15, and the interface modifier molecules 2 are covalently coupled and fixed at their side chains 4 to the source electrode 14 and drain electrode 15, respectively. Therefore, the π-electrons of the skeletons 4 of the interface modifier molecules 2 can be delocalized on the source electrodes 14 and drain electrode 15, thereby making it possible to minimize the contact resistances at the interfaces between the interface modifier molecules 2 and the source electrode 14 and drain electrode 15 in the molecular array structure 7.

Further, the direction of stacking of the driver molecules 1 of π-electron conjugated molecules in the second and further layers from the opposite ends of the array structure 4 is controlled by π-π interactions such that, by using as bases the nearly discoid planes of the skeletons 3 of the interface modifier molecules 2 arranged in parallel to the respective surfaces of the source electrode 14 and drain electrode 15, the nearly discoid plane of the skeleton of each upper-layer driver molecule 1 lies substantially in parallel and on the nearly discoid plane of the skeleton 3 of its lower-layer interface modifier molecule 2. In addition, the stacking of the driver molecules 1 themselves is controlled by π-π interactions such that the nearly discoid planes of their skeletons are stacked one over the other in parallel to each other.

Between the mutually-opposing electrodes having the source electrode 14 and drain electrode 15, the rigid molecular array structure 7 is arranged such that its contact resistances at the interfaces with the respective electrodes are very small and the direction of the stacking (the direction in which a current is allowed to flow) is controlled. The contact resistances at the interfaces with the respective electrodes in the construction provided with the interface modifier molecules 2 were about 1/30 of the contact resistances in a construction not provided with such interface modifier molecules.

The silicon substrate 16, which also serves as a gate electrode, in other words, a control electrode, is arranged along the direction of stacking, that is, the direction of conduction through the molecular array structure 7. Under a voltage applied to the gate electrode, an electric field is applied in a direction perpendicular to the direction of conduction through the molecular array structure 7, whereby the conductivity of the molecular array structure 7 is controlled.

The gap between the source electrode 14 and the drain electrode 15, said gap being equivalent to a gate length, may be, for example, about 10 nm wide (10 layers or so in terms of the number of molecule layers).

As the functional molecular device of this embodiment is formed with the molecular array structure 7 being arranged between the mutually-opposing electrodes, the contact resistances at the interfaces between the interface modifier molecules 2 as π-electron conjugated molecules and the source electrode 14 and drain electrode 15 can be minimized. Further, a current can be effectively passed in the direction of stacking of the molecular array structure 7, and the current can be controlled by a voltage applied to the gate electrode. The nanosized, insulated-gate field effect transistor 20 can, therefore, be provided with excellent electrical characteristics.

<Examples of Surface Modifier Molecules and Driver Molecules>

Figure 4:
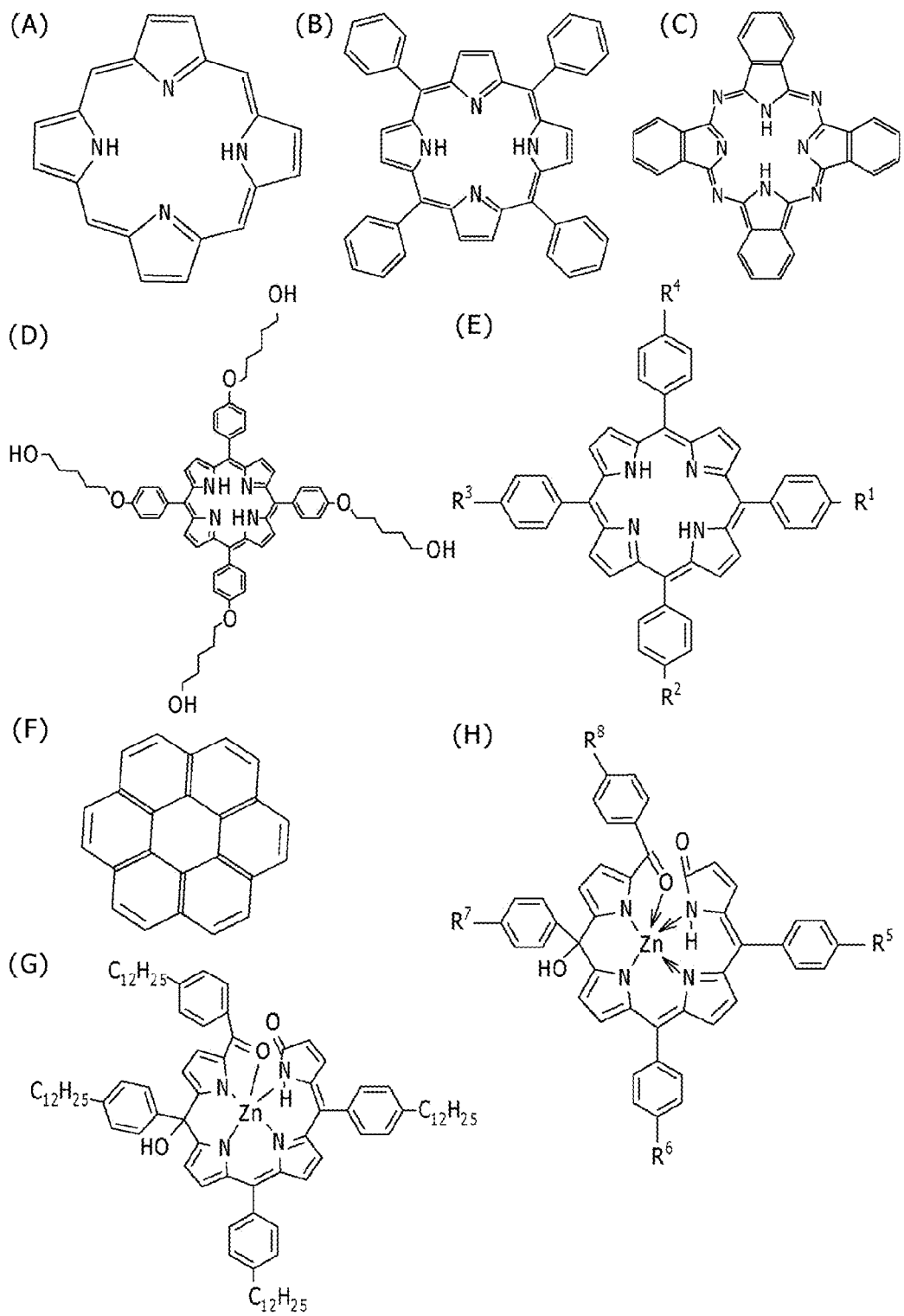
FIG. 4 are diagrams showing examples of interface modifier molecules and driver molecules.

FIG. 4 are diagrams showing examples of the interface modifier molecules and driver molecules in the embodiment of the present invention.

The π-electron conjugated molecules as the interface modifier molecules may be desirably those of a tetrapyrrole derivative, phthalocyanine derivative or fused polycyclic aromatic compound having three or more rings, more desirably those of a porphyrin derivative or coronene derivative, more specifically those, for example, of a tetraphenylporphyrin derivative represented by the above-described formula (1).

It is necessary for each interface modifier molecule that side chains provided, preferably at ends of the skeletons, with groups capable of reacting to an element in the surface of the associated electrode, for example, groups capable of reacting to hydrogen or halogen atoms in the surface of the hydrogen-terminated or halogen-terminated electrode (for example, hydroxyl groups (—OH), aldehyde groups (—CHO), vinyl groups (—CHCH$_2$), or ethynyl groups (—CCH)) are bonded and the interface modifier molecule is coupled to the electrode through covalent bonds with the element in the surface of the electrode. Representative examples of the interface modifier molecules can be those of the above-mentioned tetraphenylporphyrin.

Representative examples of the π-electron conjugated molecules as the driver molecules can be those of a complex having a metal ion such as a Zn ion approximately at its center, preferably those of a porphyrin derivative or linear tetrapyrrole, more specifically, for example, those of a biladienone derivative represented by the above-described formula (2). In such a derivative, side chains may be bonded to its skeleton.

The compounds shown in FIG. 4(A) through FIG. 4(F) are examples of the compound corresponding to the interface modifier molecules. There are shown porphyrin (21H,23H-porphyrin, $C_{20}H_{14}N_4$) in FIG. 4(A), tetraphenylporphyrin ($C_{44}H_{30}N_4$) in FIG. 4(B), phthalocyanine ($C_{32}H_{18}N_8$) in FIG. 4(C), the compound, which corresponds to the interface modifier molecule 2a described above with reference to FIG. 2, in FIG. 4(D), the tetraphenylporphyrin derivative, which is represented by the above-described formula (1), in FIG. 4(E), and coronene ($C_{24}H_{12}$) in FIG. 4(F).

It is to be noted that the compounds shown in FIGS. 4(A), 4(B), 4(C) and 4(F) each have unillustrated side chains and that each of these side chains is bonded directly or via a divalent group to one of the carbon atoms of a $C_4N$ ring (pyrrole ring) or $C_6$ ring or to the carbon atom of a methine group between two pyrrole rings. This divalent group can be an oxy group (—O—), thio group (—S—), carbonyl group (—CO—), sulfinyl group (—SO—), sulfonyl group (—SO$_2$—), imino group (—NH—), phenylene group (—C$_6$H$_4$—), or the like.

The divalent group is bonded at one end thereof to the one carbon atom of the $C_4N$ ring or $C_6$ ring or to the carbon atom of the methine group, and is bonded at the other end thereof to one end of at least one linear alkylene group contained in the side chain. To the other end of the alkylene group, a group capable of reacting to a hydrogen or halogen atom in the surface of the hydrogen-terminated or halogen-terminated electrode, for example, —OH or —CHO is bonded. The side chain may contain a phenylene group (—C$_6$H$_4$—) in addition to the alkylene group.

The compounds shown in FIGS. 4(G) and 4(H) are examples of those corresponding the driver molecules, and molecules of their derivatives are also usable as driver molecules. FIG. 4(G) shows the compound corresponding to the driver molecule 1a described above with reference to FIG. 2, and FIG. 4(H) shows a biladienone ($C_{19}H_{16}N_4O$) derivative represented by the above-described formula (2). As compounds other than those shown in FIG. 4(G) and FIG. 4(H), it is also possible to use, as driver molecules, metal ion complexes such as Zn complexes of linear tetrapyrroles such as chlorin (2,3-dihydro-21H,23H-porphyrin, $C_{20}H_{16}N_4$) derivatives, phlorin (5,22-dihydro-21H,23H-porphyrin, $C_{20}H_{16}N_4$) derivatives, biliverdine ($C_{33}H_{36}N_4O$) derivatives, bilirubin ($C_{33}H_{36}N_4O$) derivatives, biline ($C_{19}H_{14}N_4$) derivatives, bilane ($C_{19}H_{20}N_4$) derivatives, and bilene ($C_{19}H_{14}N_4$) derivatives. These compounds may each contain side chains bonded to its skeleton. It is to be noted that the compounds shown in FIGS. 4(A) through 4(F) and their derivatives can also be used as driver molecules.

Example

Based on an example, the present invention will next be described in detail. In this example, the description will be made centering around a molecular field-effect switch (PES) constructed by stacking $C_{12}H_{25}$-biladienone Zn complex between mutually-opposing, two pSi electrodes surface-modified and functionalized by covalently coupling the porphyrin derivative Por-OH to their surfaces.

A driver element in the molecular switch is constructed of a supermolecule that distorted-disk-shaped molecules of $C_{12}H_{25}$-biladienone Zn complex are repeatedly stacked in one direction through self-stacking by intermolecular π-π stacking. As this switch has permanent dipole moments, the conformation of each molecule changes under an external electric field.

The FES device includes source electrode and drain electrode formed by using a state-of-the art CMOS process, for example, with a gap of 30 nm from p-type pSi on an $SiO_2$ insulating layer of 100 nm thickness formed on a Si substrate which also serves as a gate electrode.

Por-OH contains four hydroxylalkyl groups, and the energies of the HOMO (Highest Occupied Molecular Orbital; in the frontier orbital theory, the orbital of highest energy among molecular orbitals occupied by electrons) of its n-orbitals have a value close to the Fermi energy of Si. The molecules of Por-OH are used as interface modifier molecules for modifying the surfaces of the mutually-opposing, two pSi electrodes. The interface modifier molecules are coupled through covalent bonds to the hydrogen-terminated Si electrodes, so that the efficient movements of electrons between the pSi electrodes and the interface modifier molecules are effectively facilitated.

The molecules of the distorted-disk-shaped biladienone ($C_{12}H_{25}$-biladienone Zn complex), having dipole moments, are repeatedly stacked, as driver molecules that make up the switching element, by intermolecular π-π stacking on the mutually-opposing, two pSi electrodes modified with Por-OH, and therefore, have been introduced between the two pSi electrodes. When a gate voltage to be applied to the gate electrode arranged along the one direction, in which the driver molecules were repeatedly stacked, was turned on and off, the current ratio was about 500. One month later, the switch also showed the same characteristics.

A description will hereinafter be made about the surface conditions of electrodes, the modification of electrode surfaces, the structures of electrode interfaces, and a gate-insulated field effect transistor and its characteristics.

<Electrodes>

Figure 5:
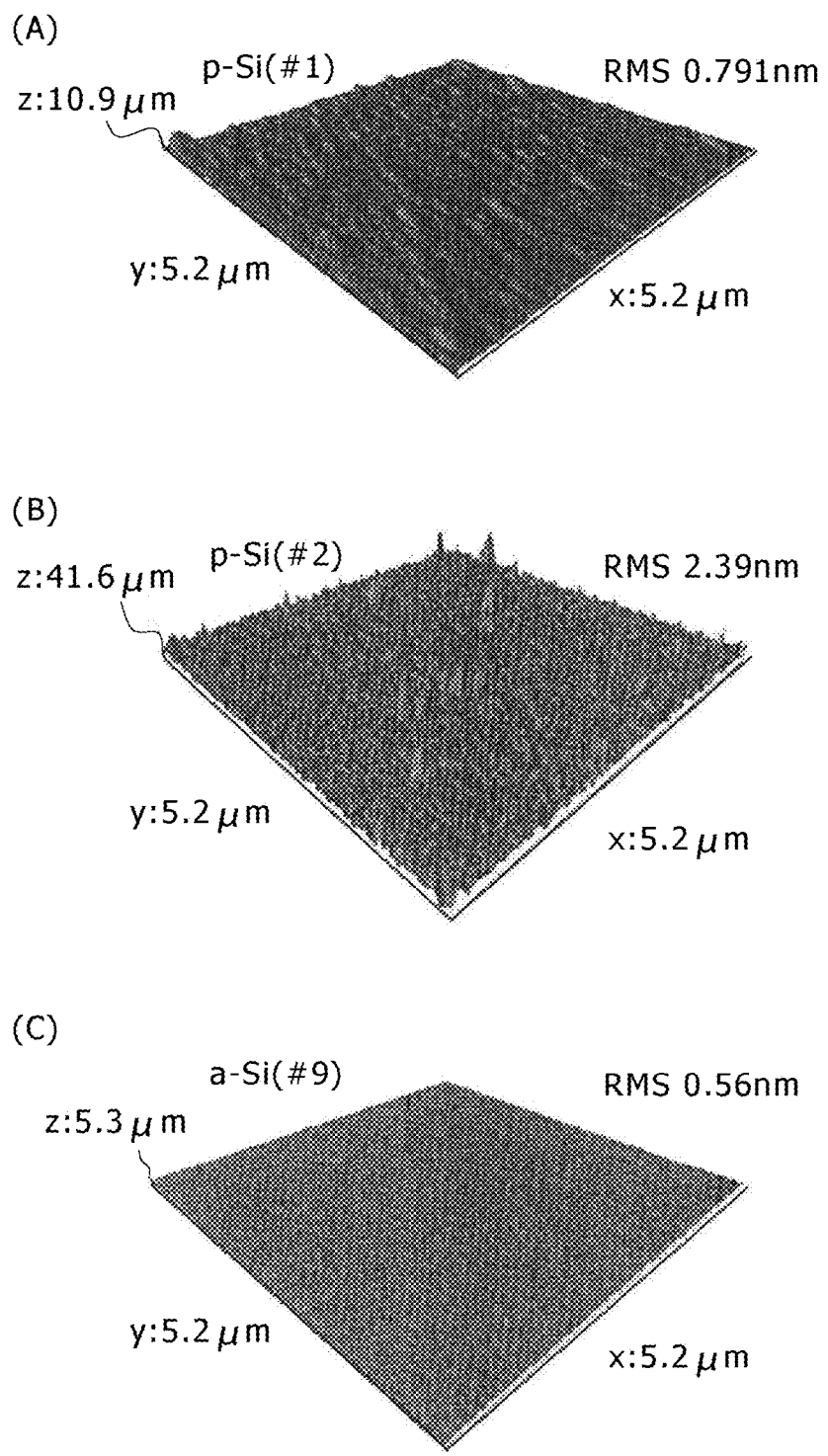
FIG. 5 are views showing the surface conditions of electrodes in an example of the present invention.

FIG. 5 are views showing the surface conditions of electrodes in the example of the present invention, and are AFM (atomic force microscope) views.

FIG. 5(A) is an AFM image of pSi (polysilicon, sample #1) with neither doping nor annealing treatment, and the standard deviation (the RMS (the root mean square) value of dispersion) of its average roughness was 0.791 nm.

FIG. 5(B) is an AFM image of a sample (#2) of pSi doped with B (boron) at $1 \times 10^{16}/cm^3$ and subjected to annealing treatment at 900° C. for 10 seconds, and the standard deviation of its average roughness was 2.39 nm.

FIG. 5(C) is an AFM image of a sample (#9) of aSi (amorphous silicon) doped with 1.2% of P (phosphorus) and subjected to annealing treatment at 900° C. for 10 seconds, and the standard deviation of its average roughness was 0.56 nm.

As the resistance of the sample (#9) shown in FIG. 5(C) had a large value, an electrode prepared by subjecting the sample (#2) of FIG. 5(B) to hydrogen termination treatment was used as an electrode to be described subsequently herein.

<Modification of Electrode Surface>

The interface modifier molecules (the π-electron conjugated molecules each of which had a nearly discoid skeleton) employed in the fabrication of the functional molecular element in this example were those of the compound shown in FIG. 4(D) and having a structure that in a tetraphenylporphin derivative represented by the above-mentioned formula (1) or shown in FIG. 4(E), the side chains $R^1$, $R^2$, $R^3$ and $R^4$ each represented $—O(CH_2)_5OH$. This compound can be considered to be a porphyrin derivative that $—(C_6H_4)O(CH_2)_5OH$ groups are bonded to the carbon atoms of the methine groups of porphyrin shown in FIG. 4(A), and is the above-mentioned Por-OH.

After the pSi sample (#2) shown in FIG. 5(B) was subjected to hydrogen termination treatment, the thus-treated pSi sample (#2) was immediately immersed in a pyridine solution of the compound (Por-OH) shown in FIG. 4(D) to conduct reflux treatment at 115° C. for four hours. The resulting pSi sample (#2) was washed with pyridine, and was then dried. In this manner, two samples modified at surfaces thereof with Por-OH (Por-OH/pSi) were prepared. These samples will hereinafter be called "interface modifier molecule/pSi-1" and "interface modifier molecule/pSi-2."

Further, the pSi sample (#2) was used as a control sample. After the pSi sample (#2) was subjected to hydrogen termination treatment, the thus-treated pSi sample (#2) was immediately immersed in the pyridine solution to conduct reflux treatment at 115° C. for four hours. The resulting pSi sample (#2) was washed with pyridine, and was then dried to provide a control sample. This sample will hereinafter be called "pyridine/pSi."

<Analysis of Modified Surfaces of Electrodes by XPS>

In the present invention, the surface of each electrode is modified by a molecule covalently coupled to the surface. On this modified surface, driver molecules are stacked, and therefore, the molecule covalently coupled to the surface of the electrode is an interface modifier molecule that modifies the interface between the electrode and the driver molecules. The state of coupling between Por-OH on the pSi surface-modified with Por-OH (Por-OH/pSi) and Si was analyzed by XPS (X-ray Photoelectron Spectroscopy).

Figure 6:
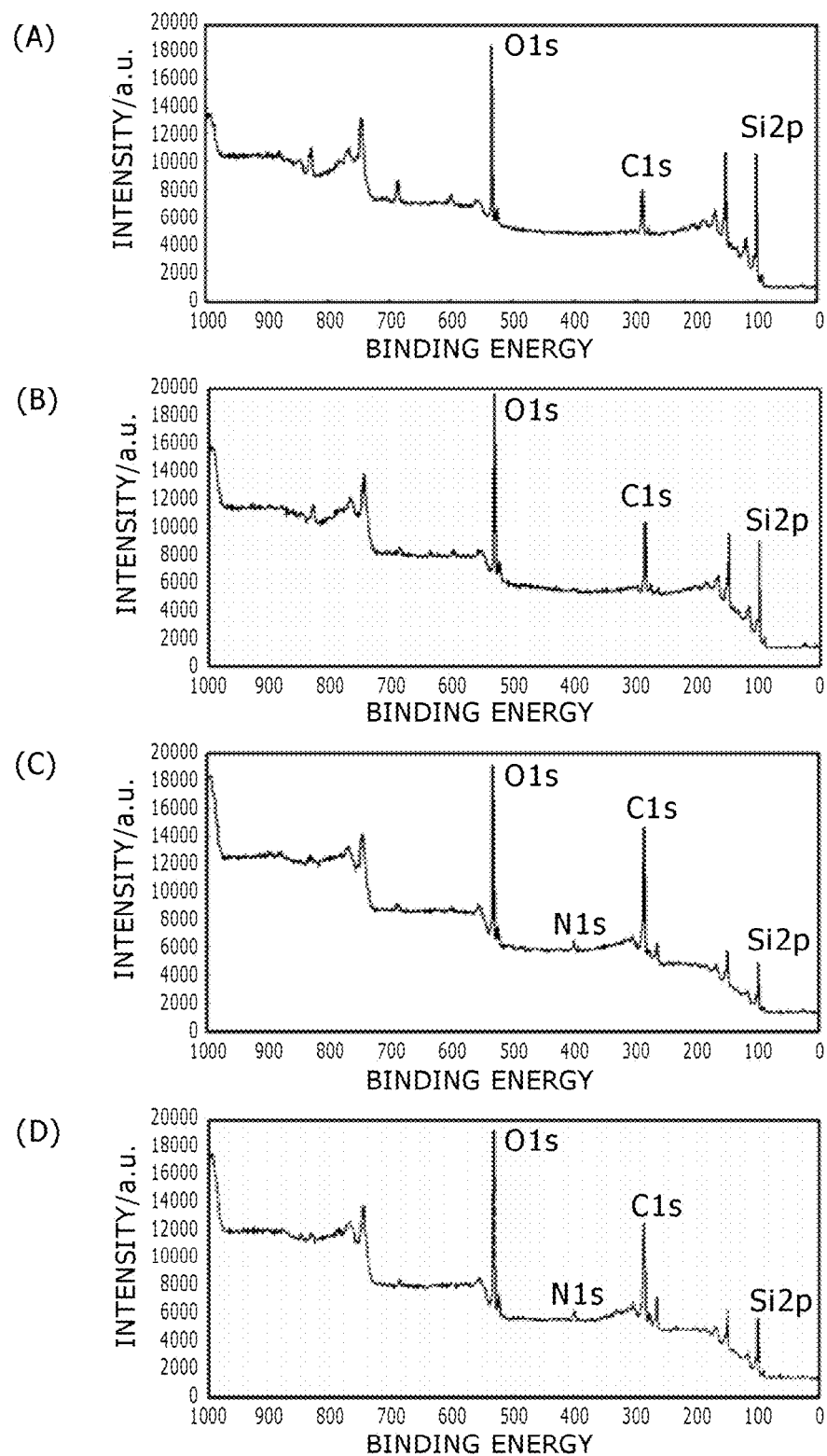
FIG. 6 are diagrams illustrating the formation of covalent bonds between electrode surfaces and interface modifier molecules in the example of the present invention.

FIG. 6 are diagrams illustrating the formation of covalent bonds between electrode surfaces and interface modifier molecules in the example of the present invention, and are diagrams showing the measurement results of the electrode surfaces by XPS (X-ray Photoelectron Spectroscopy).

In each of FIG. 6, binding energies (eV) are plotted along the abscissa, and intensities indicated by arbitrary unit are plotted along the ordinates. The measurements were performed using "JPS-9010MX PHOTOELECTRON SPECTROMETER" (MgKα Source).

FIGS. 6(A) and 6(B) illustrate the results of measurements on control samples, in which FIG. 6(A) shows the results of measurement on the pSi sample (#2) subjected to the hydrogen termination treatment and FIG. 6(B) depicts the results of measurement on the sample obtained by subjecting the pSi surface to pyridine treatment, i.e., the pyridine/pSi.

FIGS. 6(C) and 6(D) illustrate the results of measurements on the samples subjected to the treatment that interface modifier molecules were covalently coupled to pSi surfaces, i.e., the interface modifier molecule/pSi-1 and interface modifier molecule/Psi-2.

Figure 7:
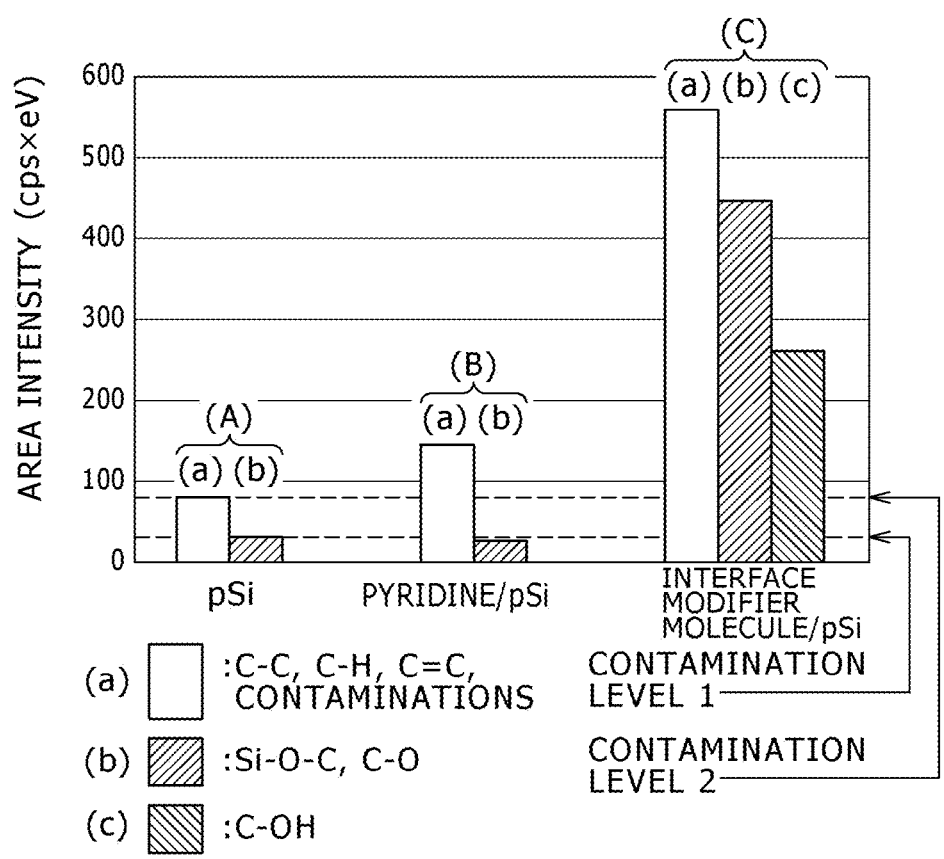
FIG. 7 is a diagram illustrating the formation of covalent bonds between electrode surfaces and interface modifier molecules in the example of the present invention.

FIG. 7 is a diagram illustrating the formation of covalent bonds between electrode surfaces and interface modifier molecules in the example of the present invention, and is a diagram in which the measurement results shown in FIG. 6 have been standardized and organized. It is to be noted that as conditions for the standardization, the energy levels of C1s orbitals as contaminated assumed the same position.

In FIG. 7, sign (A), (B) and (C) indicate the results of measurements on the pSi, pyridine/pSi and interface modifier molecule/pSi, respectively. Sign (a) indicates the area intensities (cps×eV) of C1s signals considered to be due to C—C, C—H and C═C contaminations upon XPS measurement, sign (b) indicates the area intensities (cps×eV) of C1s signals considered to be due to Si—O—C and C—), and sign (c) indicates the area intensity (cps×eV) of a C1s signal considered to be due to C—OH.

The intensities indicated by sign (A) in FIG. 7 are considered to indicate the contamination levels of the measurement results indicated by sign (B), and the intensities indicated by sign (B) are considered to indicate the contamination levels of the measurement results indicated by sign (C).

The intensities indicated by sign (A) in FIG. 7 show the contamination levels at the time of the hydrogen termination of pSi and at the time of the XPS measurement. The contamination level (a) is level 1 considered to be caused by C—C, C—H and C═C and to be due to the contaminations upon the XPS measurement, while the contamination level (b) is level 2 considered to be due to Si—O—C and C—O.

The intensities indicated by sign (B) in FIG. 7 show contamination levels at the time of the immersion of pSi in the pyridine solution, said immersion being also included upon the surface modification with Por-OH, and at the time of the XPS measurement. The intensity (a) shows a contamination level upon the XPS measurement and includes the contamination level due to the C—C, C—H and C═C in the pyridine ring, while the intensity (b) shows a contamination level considered to be due to Si—O—C and C—O.

The intensity (b) indicated by sign (B) in FIG. 7 is approximately the same as the intensity (b) indicated by sign (A). However, the intensity (a) indicated by sign (B) is greater than the intensity (a) indicated by sign (A), thereby indicating that pyridine molecules are adsorbed on the surface of pSi. Therefore, the intensities indicated by sign (B) can be contamination levels occurred at the time of the surface modification of pSi with Por-OH and at the time of the XPS measurement.

The intensities (a) and (b) indicated by sign (C) in FIG. 7 are considered to include, as contaminations, the intensity levels (a) and (b) indicated by sign (B), respectively, while the intensity (c) indicated by sign (c) is considered to include contamination and to correspond to a C1s signal due to C—OH in Por-OH. Assuming that all the OH groups of Por-OH are not coupled to Si atoms, no Si—O—C bonds exist, Por-OH is not covalently coupled to Si atoms, and the intensity (b) indicated by (C) is considered to correspond to a C1s signal due to C—O (C—O—C in —($C_6H_4$)O($CH_2$)$_5$OH of Por-OH).

As illustrated by sign (C) in FIG. 7, however, the intensity (b) has a large value significantly greater than the intensity (c). The difference between the intensity (b) and the intensity (c) is considered to correspond to the intensity of the C1s signal due to Si—O—C, and indicates the existence of OH groups to be bonded to Si atoms. At least one OH group in Por-OH is considered to form a —C—O—Si bond through its reaction to hydrogen-terminated silicon (Si—H) (Por-OH+Si—H→Por-O—Si+$H_2$), and hence, to be covalently bonded to an Si atom. In other words, the surface of Si that makes up the electrode is considered to have been modified with Por-OH covalently coupled thereto. As only the surface of Si is hydrogen-terminated to form an Si—H layer as a single layer, a surface modification layer is considered to be formed as a single layer through covalent bonds between Por-OH and Si.

<Analysis of Modified Surface of Electrode by PYS>

When photoelectron yield spectroscopy (PYS), which irradiates ultraviolet ray and measures the total electron yield of photons released from a sample as a function of energy (hv) of incident light, is applied to a sample with an organic layer formed on the surface of a substrate (organic layer/substrate), a spectrum reflected from the substrate and a spectrum reflected from the organic layer are measured superimposed when the organic layer is thin. From an analysis of the resulting spectrum, the work function of the substrate and the ionization potential of the organic layer can be determined, thereby making it possible to measure the hole injection barrier at the interface.

A sample for PYS measurement was prepared as will be described next. After the pSi sample (#2) illustrated in FIG. 5(B) was subjected to hydrogen termination treatment, the thus-treated pSi sample (#2) was immersed in a solution of the compound (Por-OH) shown in FIG. 4(D) and dissolved in pyridine to conduct reflux treatment at 110° C. for two hours. The resulting pSi sample (#2) was then immediately washed with pyridine, and was dried. In this manner, two samples (Por-OH/pSi) surface-modified with Por-OH were prepared. These samples will hereinafter be called "interface modifier molecule/pSi." Further, subsequent to hydrogen termination treatment of the pSi sample (#2), the thus-treated pSi sample (#2) was immediately immersed in the pyridine solution to conduct reflux treatment at 110° C. for two hours. The resulting pSi sample (#2) was washed with pyridine, and was then dried to provide a control sample. This sample will hereinafter be called "pyridine/pSi."

Figure 8:
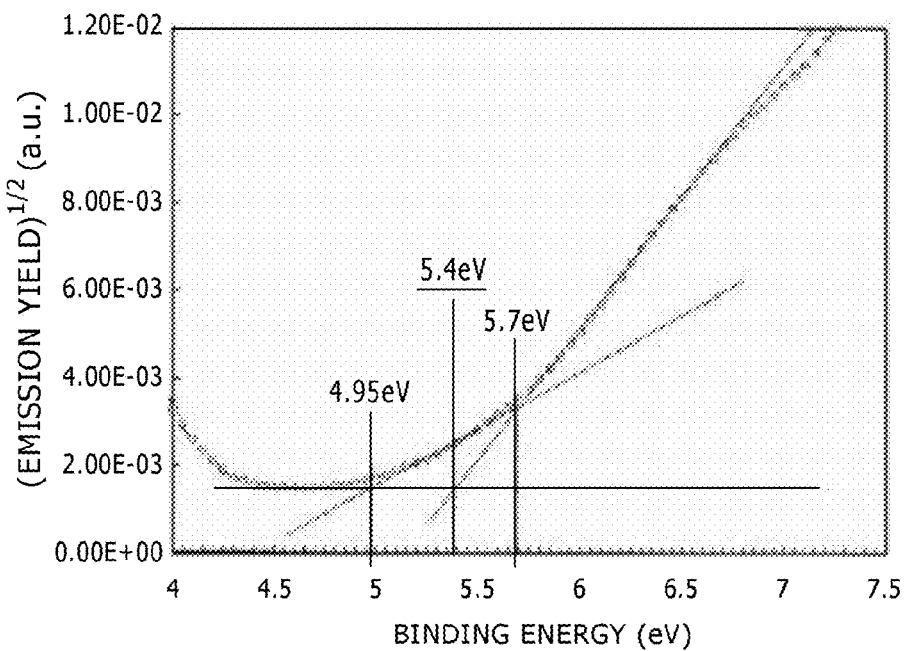
FIG. 8 are diagrams illustrating the structures of electrode interfaces in the example of the present invention as measured by photoelectron yield spectroscopy.
Figure 8:
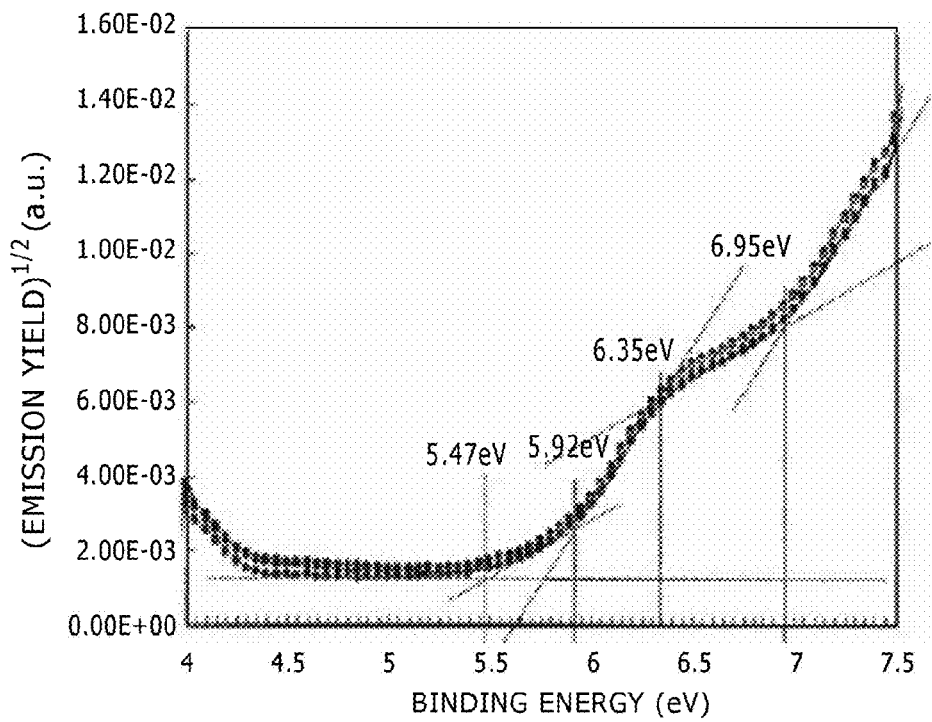

FIG. 8 are diagrams illustrating the structures of electrode interfaces in the example of the present invention as measured by photoelectron yield spectroscopy, and are diagrams showing the measurement results of electrode surfaces by PYS (photoelectron yield spectroscopy).

FIG. 8(A) illustrates the results of measurement on the control sample (pyridine/pSi) prepared by subjecting the surface of the pSi electrode to the pyridine treatment. FIG. 8(B) illustrates the results of measurements on the two samples (Por-OH/pSi) subjected to the treatment that the interface modifier molecules were covalently coupled to the pSi electrodes, respectively.

In each of FIG. 8, binding energies (eV) are plotted along the abscissas, and (emission yields)$^{1/2}$ indicated by arbitrary unit (a.u.) are plotted along the ordinates. The measurements were performed using an ionization potential measuring instrument (source: deuterium light source) ("PCR-102,"

manufactured by Sumitomo Heavy Industries Advanced Machinery Co., Ltd.). An analysis was made with reference to a publication, H Ishii, et al., "Energy Level Alignment and Interfacial Electronic Structures at Organic/Metal Organic/Organic Interfaces," Advanced Materials, 11(8), 605-625 (1999).

As shown in FIG. 8(B), the results of measurements on the two samples (Por-OH/pSi) substantially overlapped with each other, so that the PYS measurement results were obtained stably with good reproducibility. This indicates that samples having interfaces of the same quality (Por-OH/pSi) can be fabricated.

The work function of the pSi subjected to hydrogen termination treatment by treatment with HF was 5.3 eV although not shown in any figure. With the control sample prepared by immediately treating with pyridine the pSi which had been subjected to hydrogen termination treatment, on the other hand, the work function of the pSi was 5.4 eV as shown in FIG. 8(A). Further, with the sample (Por-OH/pSi) after the pSi, which had been subjected to hydrogen termination treatment, was immediately reacted to the pyridine solution of Por-OH, the work function of the pSi was 5.5 eV as shown in FIG. 8(B). As readily appreciated from the foregoing, the work functions of the pSi in the pyridine/pSi and Por-OH/pSi shifted toward a higher-energy side compared with the work function of pSi subjected to hydrogen termination treatment.

As shown in FIG. 8(A), the HOMO (the highest occupied molecular orbital by the frontier orbital theory) level (which corresponds to its ionization potential (IP)) of pyridine in the pyridine/pSi was 5.7 eV.

The HOMO level (IP) of Por-OH as a simple substance was 5.6 eV. As shown in FIG. 8(B), however, the HOMO level (IP) of the Por-OH in the Por-OH/pSi was 5.9 eV, and therefore, shifted toward a higher-energy side.

As the vacuum level of the interface between the Por-OH molecule and the pSi electrode shifted by only 0.2 eV toward the higher-energy side and a band bending occurred under the influence of polarization at the interface, the occurrence of an interaction at the interface between the molecule and the electrode is indicated.

In other words, the work function of pSi and the HOMO level (the π-electrons that play a role in conduction) of Por-OH are close to each other to such extent that they affect each other. The molecule and the electrode are, therefore, indicated to be close to each other such that they can perform a transfer of electrons therebetween.

It is to be noted that the binding energy of 4.95 eV indicated in FIG. 8(A) presumably corresponds to the adsorbed water and that the binding energies of 6.35 eV and 6.95 eV indicated in FIG. 8(B) are gathered to correspond to other orbitals in a bulk layer of molecules.

Figure 9:
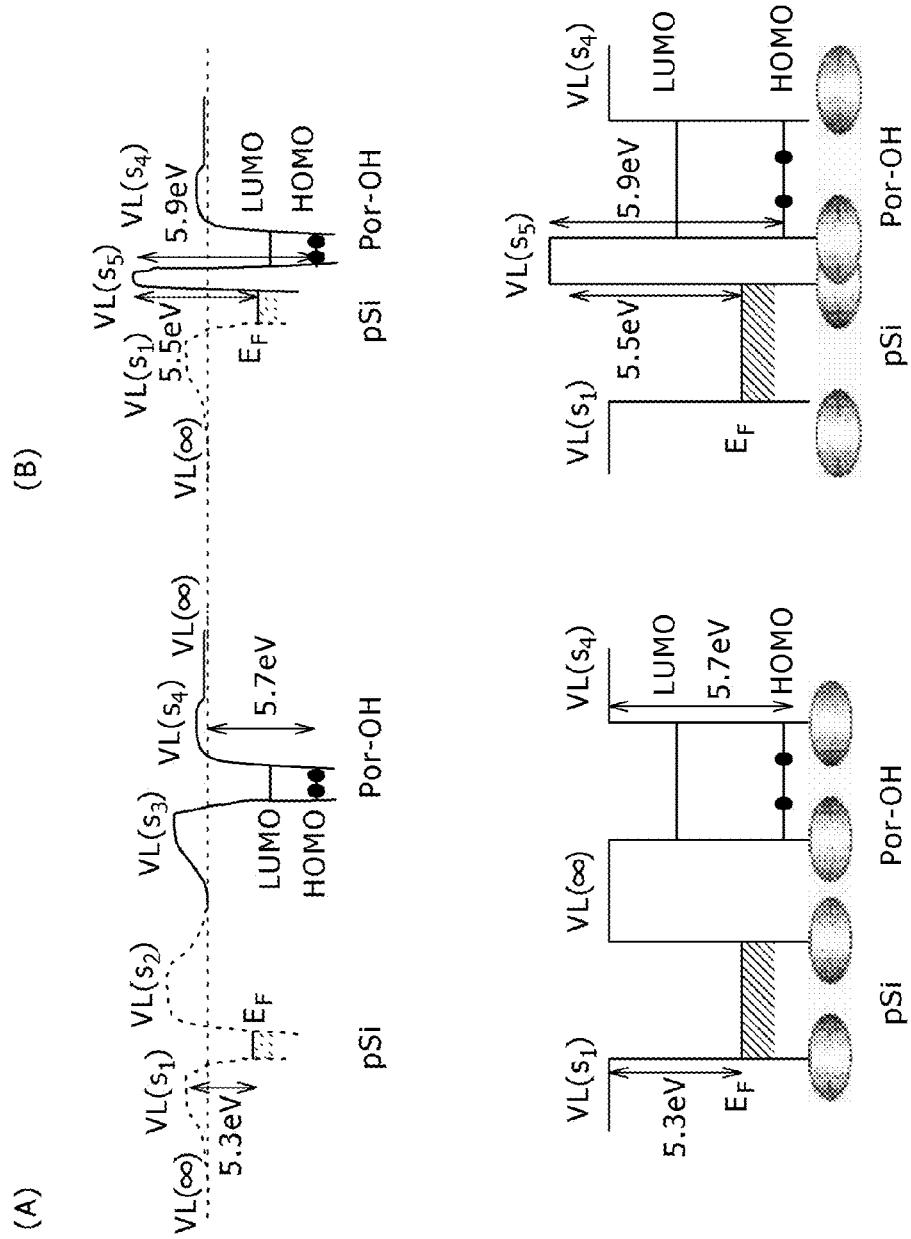
FIG. 9 are diagrams illustrating interaction between an electrode and an interface modifier molecule in the example of the present invention.

Organizing the above-described measurement results, the measurement results can be summarized as illustrated in FIG. 9 which is to be described next.

FIG. 9 are diagrams illustrating interaction between an electrode (pSi) and an interface modifier molecule (Por-OH) in the example of the present invention, and are diagrams that the results illustrated in FIG. 8 were organized as energy band diagrams at the electrode interface.

FIG. 9(A) is an energy band diagram at the interface between the electrode (pSi) and the molecule (Por-OH) when they are so remote from each other that they do not affect each other, and FIG. 9(B) is an energy band diagram at the interface between the electrode (pSi) and the molecule (Por-OH) when they are so close to each other that they affect each other.

In each of FIG. 9, HOMO and LOMO indicate the energy levels of the highest occupied molecular orbital and lowest occupied molecular orbital by the frontier orbital theory, respectively, and EF indicates a Fermi level. VL indicates a vacuum level, ∞ indicates a position remote over an infinite distance from the interface, $s_1$ indicates the position of an interface 1, $s_2$ indicates the position of an interface 2, $s_3$ indicates the position of an interface 3, $s_4$ indicates the position of an interface 4, and $s_5$ indicates the position of an interface 5.

When the pSi and Por-OH molecule are so remote from each other that they do not affect each other as shown in FIG. 9(A), the work function of the pSi and the ionization potential of the Por-OH molecule have the same values as those of pSi and a Por-OH molecule as simple substances, and have not changed.

When the pSi and Por-OH molecule are so close to each other that they affect each other as shown in FIG. 9(B), the work function of the pSi and the ionization potential of the Por-OH molecule are shifted toward higher-energy sides compared with the values of pSi and a Por-OH molecule as simple substances. In view of the magnitudes of these shifts, the interaction between the pSi and the Por-OH molecule is different from and stronger than the dipole-dipole interaction. It is, therefore, presumed that the interaction is not attributed to any physical adsorption between the molecule and the electrode interface and that the plane of π-electrons in the molecule and the electrode act repulsively against each other to have higher energy because they are forced to become close to each other by covalently coupling the side chains of the molecule to the electrode interface. As mentioned above, the OH groups of Por-OH are considered to form C—O—Si bonds through their reaction to hydrogen-terminated silicon (Si—H), and hence, to be covalently bonded to Si atoms.

<Fabrication of Insulated-Gate Field Effect Transistor>

After mutually-opposing, two pSi electrodes were subjected to hydrogen termination treatment, the pSi electrodes were immediately immersed in a solution of Por-OH dissolved in pyridine to conduct reflux treatment at 115° C. for four hours. Subsequently, the thus-treated pSi electrodes were washed with pyridine and dried, whereby Por-OH was covalently coupled to pSi to achieve surface modification of pSi with Por-OH.

The π-electron conjugated molecules (driver molecules), which were used in the fabrication of the functional molecular element in this example and had a nearly discoid skeleton, are those of a compound having a structural formula that in the above-described tetraphenylporphyrin derivative represented by the formula (2) or in the π-electron conjugated molecule shown in FIG. 4(G), the side chains $R^5$, $R^6$, $R^7$ and $R^8$ each represent —$(CH_2)_{11}CH_3$, specifically are those of $C_{12}H_{25}$-biladienone Zn complex having dodecyl groups, —$C_{12}H_{25}$, bonded to the para-positions of the phenyl groups.

After the surface-modified pSi was immersed in a solution of $C_{12}H_{25}$-biladienone Zn complex dissolved in pyridine and was subjected to reflux treatment at from 110° C. to 160° C. for four hours, the thus-treated pSi was washed with pyridine and was dried, whereby molecules of $C_{12}H_{25}$-biladienone Zn complex were stacked as driver molecules through self-stacking on the pSi-modifying molecule.

Figure 10:
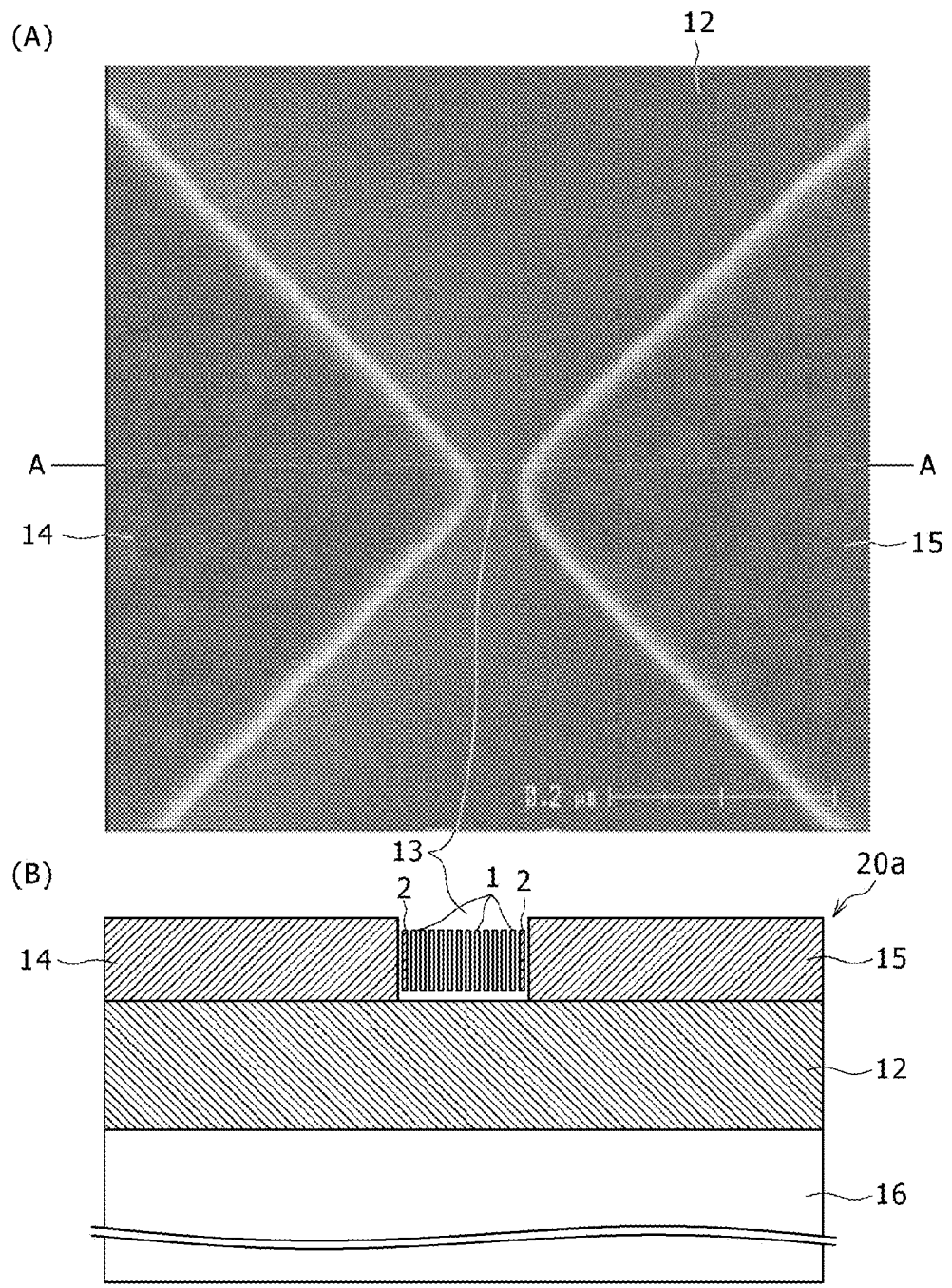
FIG. 10 are views illustrating one example of insulated-gate field effect transistor in the example of the present invention.

FIG. 10 are views illustrating one example of insulated-gate field effect transistor in the example of the present invention, and showing a vicinity of an electrode gap. FIG. 10(A) shows a surface SEM image, and FIG. 10(B) is a cross-sectional view taken along A-A.

As illustrated in FIG. 10, the insulated-gate field effect transistor 20a is constructed as a bottom-gate transistor. On a silicon substrate 16 of about 0.2 mm in thickness which also serves as a gate electrode, an $SiO_2$ layer of 100 nm in thickness is formed as a gate insulating layer 12. On the gate insulating layer 12, source electrode 14 and drain electrode 15 each of 50 nm in thickness are formed from pSi with an electrode gap 13 of from 10 nm to 50 nm by using a state-of-the art CMOS process. In the example illustrated in FIG. 10, the electrode gap 13 is about 30 nm wide.

On surfaces of the source electrode 14 and drain electrode 15, Por-OH is covalently coupled as interface modifier molecules 2 so that modifier molecule layers are formed as single layers. By stacking molecules of $C_{12}H_{25}$-biladienone Zn complex as driver molecules 1 on the respective modifier molecule layers through self-stacking by intermolecular π-π stacking, a molecular array structure formed of the interface modifier molecules 2 and driver molecules 1 is formed in the electrode gap 13 as schematically illustrated in FIG. 10(B). The number of molecule layers stacked in the electrode gap 13 of about 30 nm may presumably be approximately 30 layers or so.

Molecules of $C_{12}H_{25}$-biladienone Zn complex are stacked through self-stacking substantially in parallel to the skeletons of the Por-OH molecules covalently coupled to the surfaces of both the electrodes 14, 15. Accordingly, the molecular array structure is stably formed in the gap 13 where the electrodes 14, 15 are closest to each other, and it becomes harder to form a stack of substantially parallel molecules of $C_{12}H_{25}$-biladienone Zn complex between the electrodes as the positions on the electrodes become more remote from the gap 13. Therefore, the formation of the stable molecular array structure is limited to the vicinity of the electrode gap 13, and in parts other than the vicinity, molecules of $C_{12}H_{25}$-biladienone Zn complex are unstably stacked and, when washed, are eliminated together with unstacked molecules.

<Characteristics of Insulated-Gate Field Effect Transistor>

A description will be made about characteristics of the insulated-gate field effect transistor fabricated as described above. $I_d$ represents drain current, $V_d$ represents drain voltage, and $V_g$ represents gate voltage.

Figure 11:
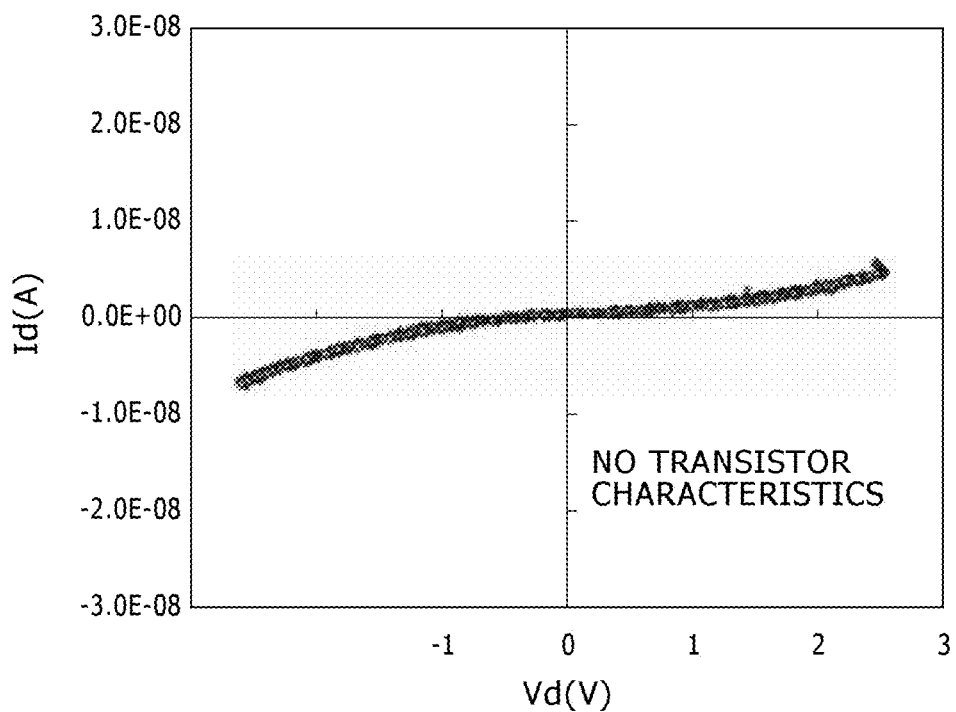
FIG. 11 are diagrams illustrating characteristics of the insulated-gate field effect transistor in the example of the present invention.
Figure 11:
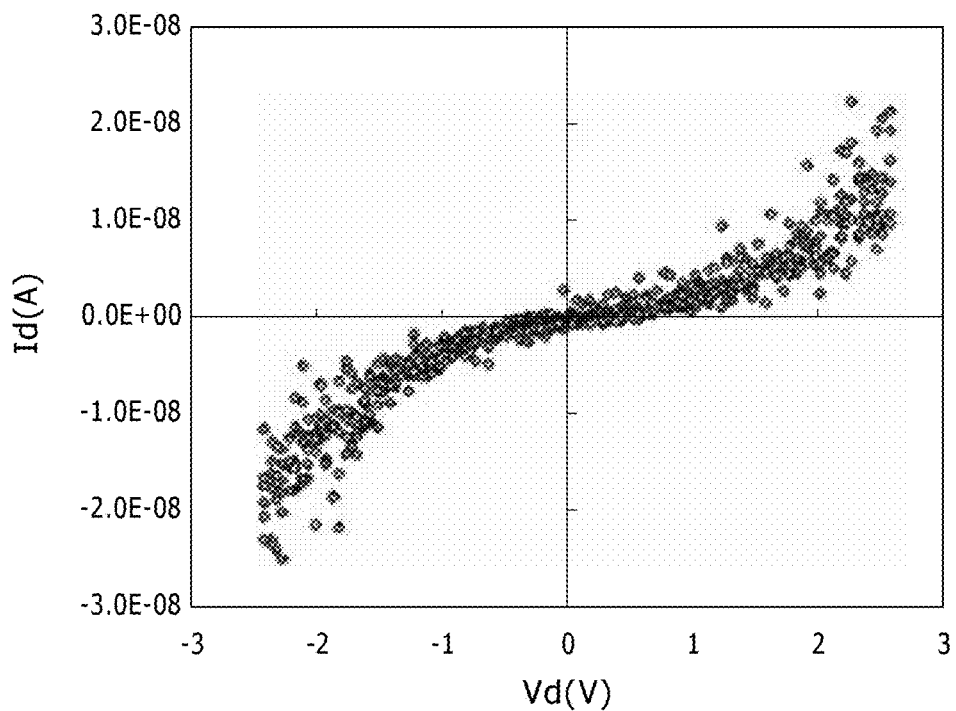

FIG. 11 are diagrams illustrating characteristics of the insulated-gate field effect transistor in the example of the present invention, and show drain current-drain voltage characteristics (($I_d$-$V_d$) curves (at $V_g$=0, gate off)).

FIG. 11(A) shows the ($I_d$-$V_d$) curve of the transistor without the driven molecules 1 stacked therein. FIG. 11(B) is a diagram illustrating the ($I_d$-$V_d$) curve of the transistor in which the molecular array structure of the stacked driver molecules 1 is formed in the electrode gap 13.

As shown in FIG. 11(A), no transistor characteristics are exhibited in the state that the driver molecules 1 are not stacked. As depicted in FIG. 11(B), on the other hand, transistor characteristics are exhibited owing to the construction of the transistor that includes the driver molecules stacked in the gap between the gate electrode and the drain electrode and has the construction of pSi/interface modifier molecule/driver molecules/interface modifier molecule/pSi=pSi/molecular array structure/pSi.

Figure 12:
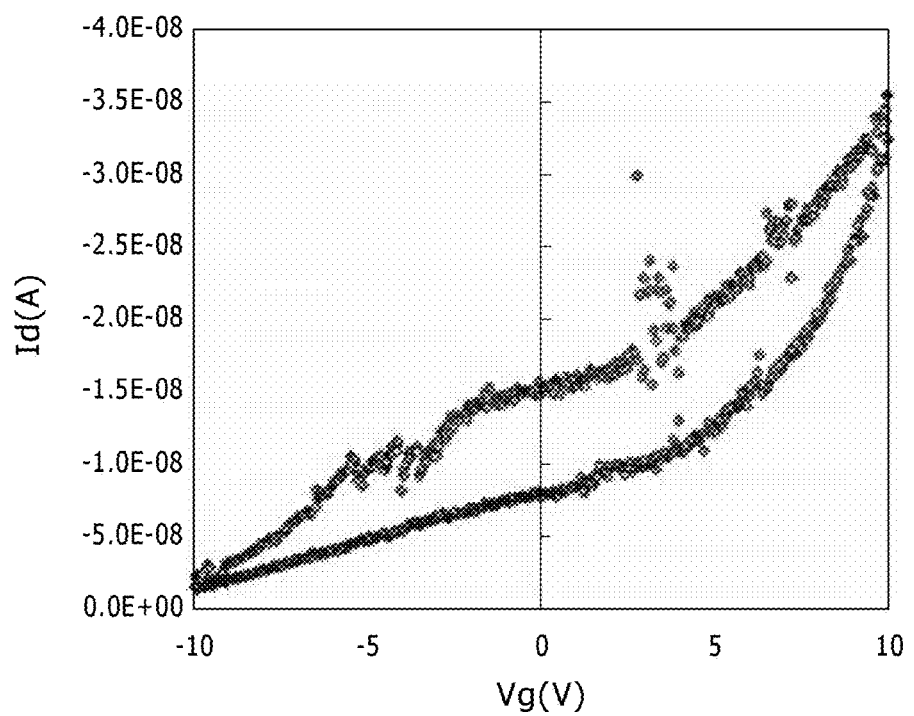
FIG. 12 are diagrams illustrating characteristics of the insulated-gate field effect transistor in the example of the present invention.
Figure 12:
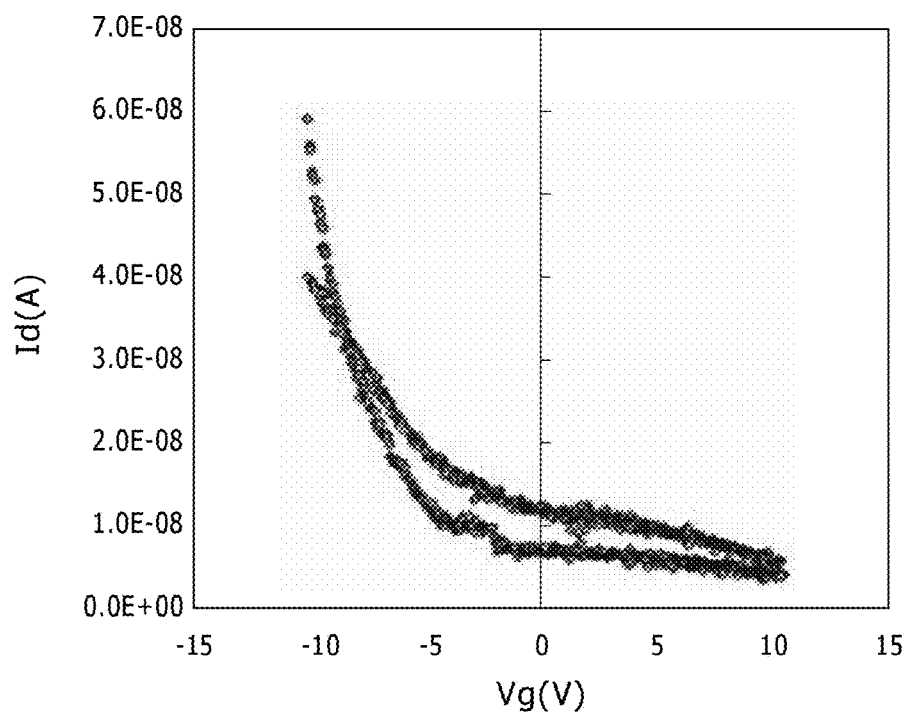

FIG. 12 are diagrams illustrating characteristics of the insulated-gate field effect transistor in the example of the present invention, and shows drain current-gate voltage characteristics (($I_d$-$V_g$) curves) of the transistor that includes the driver molecules stacked in the gap between the gate electrode and the drain electrode and has the construction of pSi/interface modifier molecule/driver molecules/interface modifier molecule/pSi=pSi/molecular array structure/pSi.

FIG. 12(A) shows an ($I_d$-$V_g$) curve when set at $V_d$=−2.5 V, while FIG. 12(B) shows an ($I_d$-$V_g$) curve when set at $V_d$=+2.5 V. Both the ($I_d$-$V_g$) curves indicate hysteresis characteristics.

Figure 13:
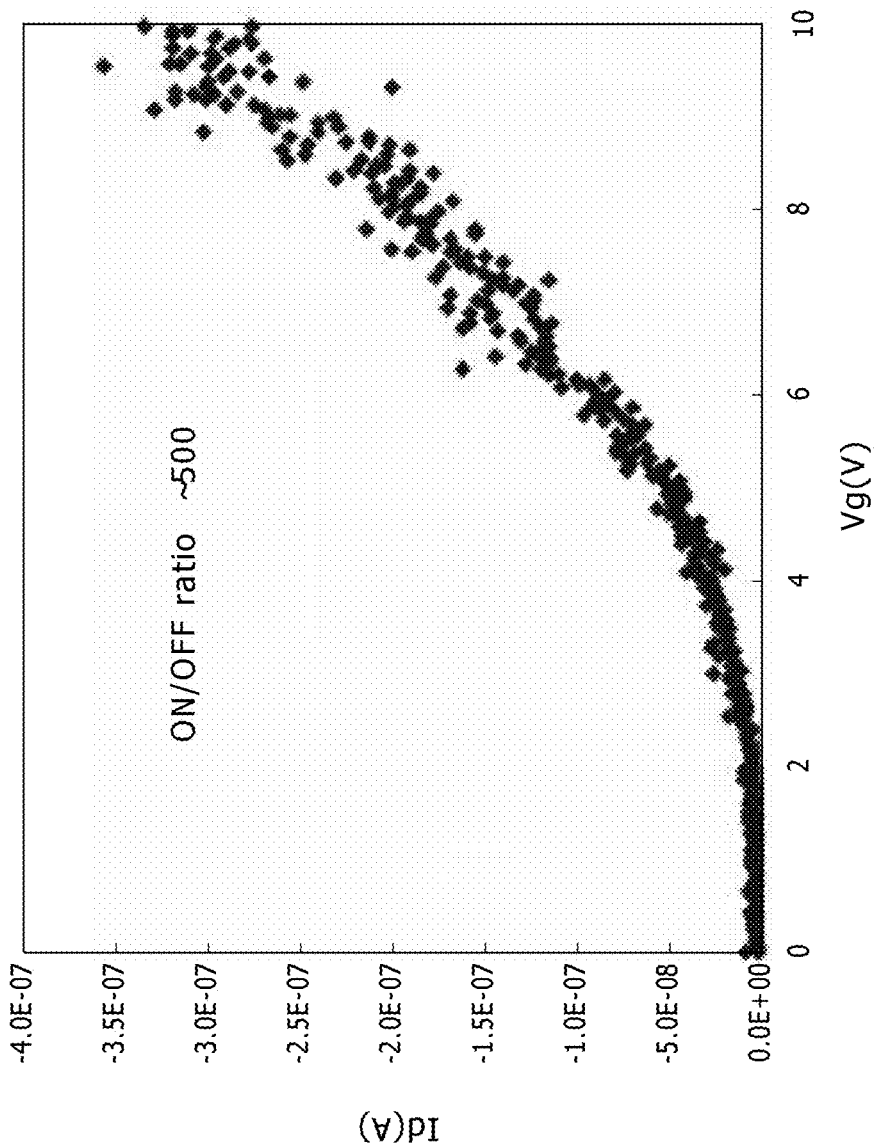
FIG. 13 is a diagram illustrating repetition characteristics of the insulated-gate field effect transistor in the example of the present invention.

FIG. 13 is a diagram illustrating repetition characteristics of an insulated-gate field effect transistor in the example of the present invention, and shows an ($I_d$-$V_g$) curve when set at $V_d$=−2.5 V.

FIG. 13 shows the results of measurement on the transistor different from those described above with reference to FIG. 11 and FIG. 12. Strictly speaking, the transistors relating to FIG. 11 and FIG. 12 and the transistor relating to FIG. 13 do not show the same characteristics because they are different in the gap between the source electrode and the drain electrode and also in the construction of salients of both electrodes.

The results shown in FIG. 13 illustrate, in a superimposed manner, the characteristics of the transistor shortly after its fabrication and the characteristics of the same transistor after it was left over at room temperature in air for one month, and illustrate the same transistor characteristics. When a gate voltage to be applied to the gate electrode was turned on and off, the current ratio was about 500. When the ($I_d$-$V_g$) curve was repeatedly measured $10^8$ times, the identical transistor characteristics were shown, and absolutely no change was indicated in transistor characteristics.

As described above, the fabricated transistor stably showed characteristics with good reproducibility even when left over in air for a long time, and therefore, had high reliability.

According to the above-described embodiments and example of the present invention, side chains of discoid or nearly discoid π-electron conjugated molecules are covalently coupled to atoms, which make up electrodes, to form modifier molecule layers as single layers on surfaces of the electrodes, and on the modifier molecule layers, driver molecules as functional molecules are stacked in a columnar form through self-stacking to form a molecular array structure in combination with the modifier molecule layers. It is, therefore, possible to provide a functional molecular element and a functional molecular device each having a reduced contact resistance at each of the interfaces between the electrodes and the molecular array structure.

The present invention has been described above based on the embodiments of the present invention. It is, however, to be noted that the present invention shall not be limited to the above-described embodiments and various modifications can be made based on the technical concept of the present invention. For example, the thicknesses, sizes and the like of the respective portions that make up the transistor can be suitably set at will as needed to satisfy its performance such that the transistor can conform to its application. Needless to say, the functional molecular element is not constructed as a transistor, can be fabricated as an element of from a micrometer size to a nanometer size with the same materials in accordance with the same principle, and can also be constructed as a memory, logic circuit or the like.

INDUSTRIAL APPLICABILITY

As has been described above, the present invention can provide a functional molecular element having a reduced contact resistance with each electrode and its fabrication process, and a functional molecular device. These functional molecular element and functional molecular device can be used in a variety of electronic device fields.

DESCRIPTION OF REFERENCE SYMBOLS

1 . . . Driver molecule, 2 . . . Interface modifier molecule, 3 . . . Nearly discoid skeleton, 4 . . . Side chain, 5, 6, 5a, 5b . . . Electrodes, 7 . . . Molecular array structure, 8 . . . Flowing direction of a current, 10 . . . Functional molecular element, 12 . . . Gate insulating layer, 13 . . . Electrode gap, 14 . . . Source electrode, 15 . . . Drain electrode, 16 . . . Silicon substrate (which also serves as a gate electrode), 17 . . . Source electrode terminal, 18 . . . Drain electrode terminal, 19 . . . Gate electrode terminal, 20, 20a . . . Insulated-gate field effect transistors.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A functional molecular element comprising:
    electrodes,
    first π-electron conjugated molecules, each of which has:
        a first skeleton having a plane or substantial plane of a π-electron conjugated system, and
        side chains bonded to the first skeleton, the first skeletons of said first π-electron conjugated molecules being arranged substantially in parallel to the electrodes and being coupled at the side chains thereof to the electrodes, respectively, through covalent bonds, and
    a molecular array structure formed of the first π-electron conjugated molecules and second π-electron conjugated molecules stacked together such that the functional molecular element is provided with a function to pass a current in one direction intersecting with the planes of the first skeletons,
    wherein each of the second π-electron conjugated molecules are different in species from the first π-electron conjugated molecules, and the second π-electron conjugated molecules are arranged in the molecular array structure between the first π-electron conjugated molecules.

2. The functional molecular element according to claim 1, wherein the second π-electron conjugated molecules are each provided with a second skeleton having a plane or substantial plane of a π-electron conjugated system, the second skeletons of the second π-electron conjugated molecules are stacked between the first skeletons by intermolecular π-π stacking, the second skeletons are repeatedly stacked together in one direction by intermolecular π-π stacking, and the molecular array structure is formed of the first and second π-electron conjugated molecules such that the functional molecular element is provided with a function to pass a current in the one direction.

3. The functional molecular element according to claim 1, wherein the electrodes are formed of polysilicon or amorphous silicon.

4. The functional molecular element according to claim 2, wherein:
    the functional molecular element has, as the electrodes, first and second electrodes opposing each other,
    the side chains of the first π-electron conjugated molecules are coupled to the first and second electrodes, respectively, through covalent bonds, and
    the molecular array structure is formed between the first electrode and the second electrode.

5. The functional molecular element according to claim 4, wherein the electrodes further include a third electrode such that the current can be controlled by the third electrode.

6. The functional molecular element according to claim 1, wherein the first π-electron conjugated molecules are those of a tetrapyrrole derivative, a phthalocyanine derivative, or a fused polycyclic aromatic compound having three or more rings.

7. The functional molecular element according to claim 6, wherein the first electron conjugated molecules are those of a porphyrin derivative or a coronene derivative.

8. The functional molecular element according to claim 7, wherein the first π-electron conjugated molecules are those of a tetraphenylporphyrin derivative represented by the following formula (1):

[Formula 1]

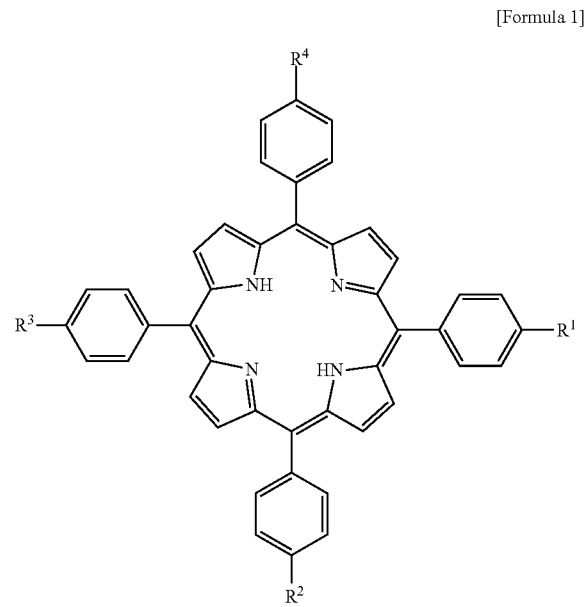

wherein $R^1$, $R^2$, $R^3$ and $R^4$ may be the same or different and each represent a hydroxyl group or a substituted or unsubstituted, linear hydrocarbon group.

9. The functional molecular element according to claim 1, wherein the side chains are each an alkyl group, an alkoxy group, a silicon analog of an alkyl group, or an aromatic ring with an alkyl group, an alkoxy group or a silicon analog of an alkyl group bonded thereto.

10. The functional molecular element according to claim 2, wherein the second π-electron conjugated molecules are those of a porphyrin derivative or a linear tetrapyrrole.

11. The functional molecular element according to claim 10, wherein the second π-electron conjugated molecules are those of a biladienone derivative represented by the following formula (2):

[Formula 2]

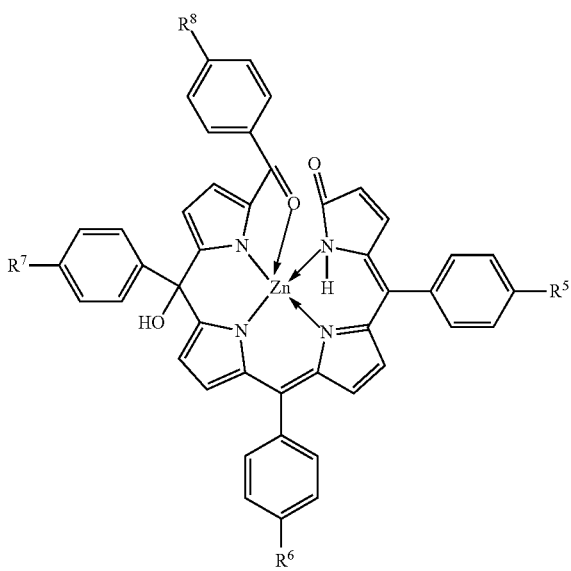

wherein $R^5$, $R^6$, $R^7$ and $R^8$ may be the same or different and each represent an alkyl group having from 3 to 12 carbon atoms.

12. A process for fabricating a functional molecular element, comprising:
 a first step of covalently bonding first π-electron conjugated molecules, each of which has a first skeleton having a plane or substantial plane of a π-electron conjugated system and has side chains bonded to the first skeleton, at the side chains thereof to electrodes such that the first skeletons are arranged substantially in parallel to the electrodes, and
 a second step of stacking second π-electron conjugated molecules, each of which has a second skeleton having a plane or substantial plane of a π-electron conjugated system, by intermolecular π-π stacking of the second skeletons between the first skeletons, and repeatedly stacking the second skeletons in one direction by intermolecular π-π stacking such that a molecular array structure is formed with the first and second π-electron conjugated molecules included therein.

13. The process according to claim 12, wherein the first π-electron conjugated molecules are different in species from the second π-electron conjugated molecules.

14. A functional molecular device comprising:
 mutually-opposing, first and second electrodes,
 first π-electron conjugated molecules, each of which has:
  a first skeleton having a plane or substantial plane of a π-electron conjugated system, and
  side chains bonded to the first skeleton, the first skeletons of said first π-electron conjugated molecules being arranged substantially in parallel to the first and second electrodes and being coupled at the side chains thereof to the first and second electrodes, respectively, through covalent bonds,
 second π-electron conjugated molecules, each of which is provided with a second skeleton having a plane or substantial plane of a π-electron conjugated system, stacked by intermolecular π-π stacking of the second skeletons of the second π-electron conjugated molecules between the first skeletons, said second skeletons being repeatedly stacked in one direction by intermolecular π-π stacking, and
 a molecular array structure formed by the first and second π-electron conjugated molecules between the first electrode and the second electrode,
 whereby the functional molecular device is provided with a function to pass a current in the one direction, and
 wherein each of the second π-electron conjugated molecules are different in species from the first π-electron conjugated molecules, and the second π-electron conjugated molecules are arranged in the molecular array structure between the first π-electron conjugated molecules.

15. The functional molecular device according to claim 14, wherein the first and second electrodes are formed of polysilicon or amorphous silicon.

16. The functional molecular device according to claim 14, further comprising
 a third electrode such that the current can be controlled by the third electrode.

17. The functional molecular device according to claim 16, wherein the third electrode is arranged along the one direction as a control electrode for applying an electric field to the molecular array structure and controlling the current.

18. The functional molecular device according to claim 17, wherein the third electrode is a gate electrode, a gate insulating layer is arranged on the gate electrode, and the first electrode and second electrode are formed as a source electrode and a drain electrode, respectively, on the gate insulating layer such that the functional molecular device is constructed as an insulated-gate field effect transistor.

19. A functional molecular element comprising:
 electrodes,
 first π-electron conjugated molecules, each of which has:
  a first skeleton having a plane or substantial plane of a π-electron conjugated system, and
  side chains bonded to the first skeleton, the first skeletons of said first π-electron conjugated molecules being arranged substantially in parallel to the electrodes and being coupled at the side chains thereof to the electrodes, respectively, through covalent bonds, and
 a molecular array structure formed of the first π-electron conjugated molecules and second π-electron conjugated molecules stacked together such that the functional molecular element is provided with a function to pass a current in one direction intersecting with the planes of the first skeletons,
 wherein the first π-electron conjugated molecules are those of a tetraphenylporphyrin derivative represented by the following formula (1):

[Formula 1]
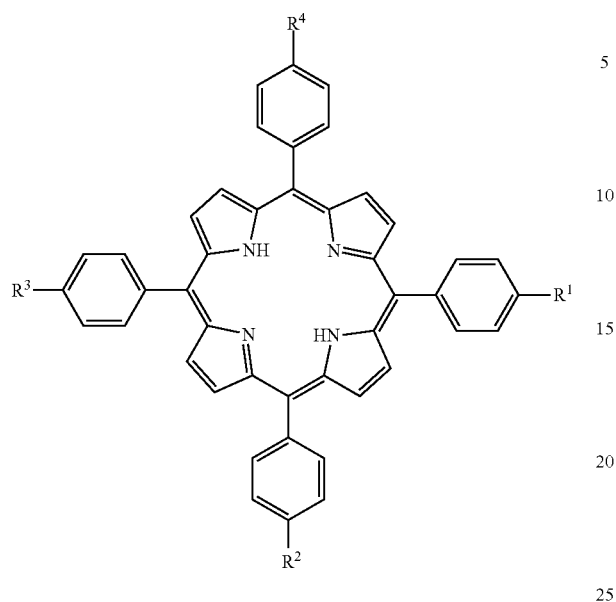
wherein $R^1$, $R^2$, $R^3$ and $R^4$ may be the same or different and each represent a hydroxyl group or a substituted or unsubstituted, linear hydrocarbon group.
* * * * *